(12) United States Patent
Chu et al.

(10) Patent No.: US 7,829,440 B2
(45) Date of Patent: Nov. 9, 2010

(54) METHOD OF SEPARATING SEMICONDUCTOR DIES

(75) Inventors: Jiunn-Yi Chu, Chubei (TW); Chao-Chen Cheng, Hsinchu (TW); Chen-Fu Chu, Hsinchu (TW); Trung Tri Doan, Baoshan Township (TW)

(73) Assignee: SemiLEDS Optoelectronics Co. Ltd., Chu-Nan (TW)

( * ) Notice: Subject to any disclaimer, the term of this patent is extended or adjusted under 35 U.S.C. 154(b) by 249 days.

(21) Appl. No.: 11/835,289

(22) Filed: Aug. 7, 2007

(65) Prior Publication Data

US 2008/0032488 A1 Feb. 7, 2008

Related U.S. Application Data

(60) Provisional application No. 60/821,608, filed on Aug. 7, 2006.

(51) Int. Cl.
*H01L 21/301* (2006.01)

(52) U.S. Cl. ............................ 438/464; 438/33; 438/68; 438/113; 438/114; 438/458; 438/460; 438/461; 438/462; 438/463; 438/465; 257/E21.214; 257/E21.237

(58) Field of Classification Search ......... 438/460–465, 438/113–114, 458, 33, 48; 257/E21, 214, 257/E21.237
See application file for complete search history.

(56) References Cited

U.S. PATENT DOCUMENTS 5,157,001 A * 10/1992 Sakuma ...................... 438/465
5,552,345 A * 9/1996 Schrantz et al. ............. 438/460
6,562,648 B1 * 5/2003 Wong et al. ................... 438/46
6,660,550 B2 * 12/2003 Sato ............................ 438/34
7,452,739 B2 * 11/2008 Chu et al. ..................... 438/33
2002/0106871 A1 * 8/2002 Le et al. ...................... 438/465
2006/0079024 A1 * 4/2006 Akram ........................ 438/110
2006/0105542 A1 * 5/2006 Yoo ............................. 438/455
2006/0128118 A1 * 6/2006 Nagahama et al. .......... 438/458

OTHER PUBLICATIONS

PCT International Search Report and Written Opinion dated Mar. 3, 2008.

* cited by examiner

*Primary Examiner*—Wael M Fahmy
*Assistant Examiner*—Minchul Yang
(74) *Attorney, Agent, or Firm*—Patterson & Sheridan, L.L.P.

(57) ABSTRACT

A method for the separation of multiple dies during semiconductor fabrication is described. On an upper surface of a semiconductor wafer containing multiple dies, a seed metal layer may be used to grow hard metal layers above it for handling. Metal may be plated above these metal layers everywhere except where a block of stop electroplating (EP) material exists. The stop EP material may be obliterated, and a barrier layer may be formed above the entire remaining structure. The substrate may be removed, and the individual dies may have any desired bonding pads and/or patterned circuitry added to the semiconductor surface. The remerged hard metal after laser cutting and heating should be strong enough for handling. Tape may be added to the wafer, and a breaker may be used to break the dies apart. The resulting structure may be flipped over, and the tape may be expanded to separate the individual dies.

46 Claims, 22 Drawing Sheets

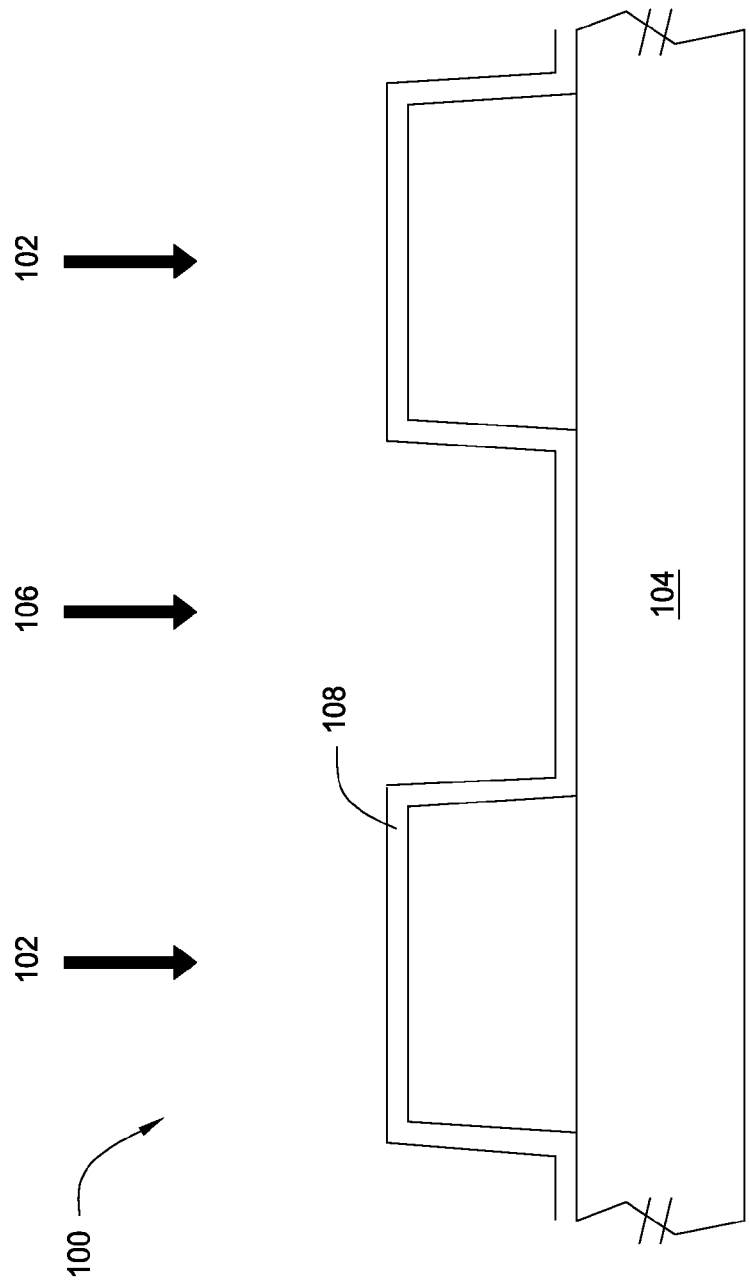

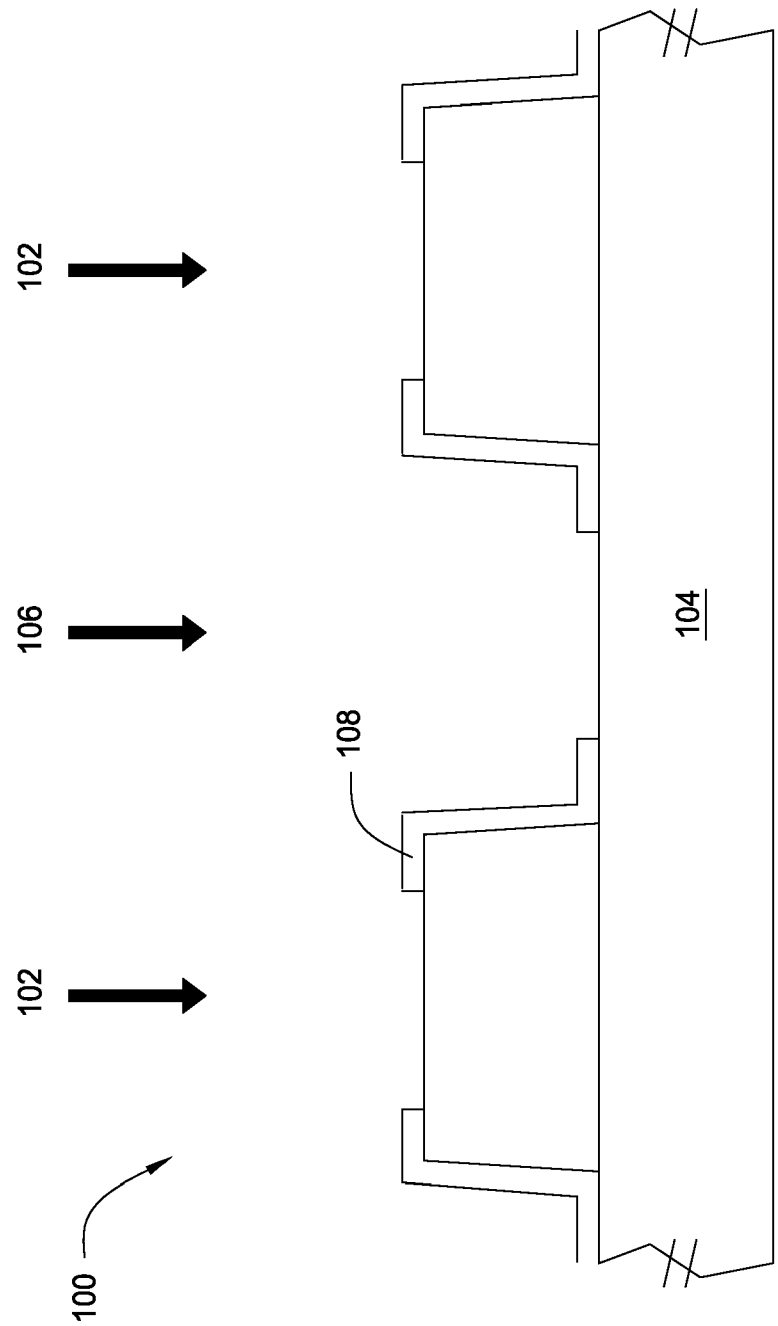

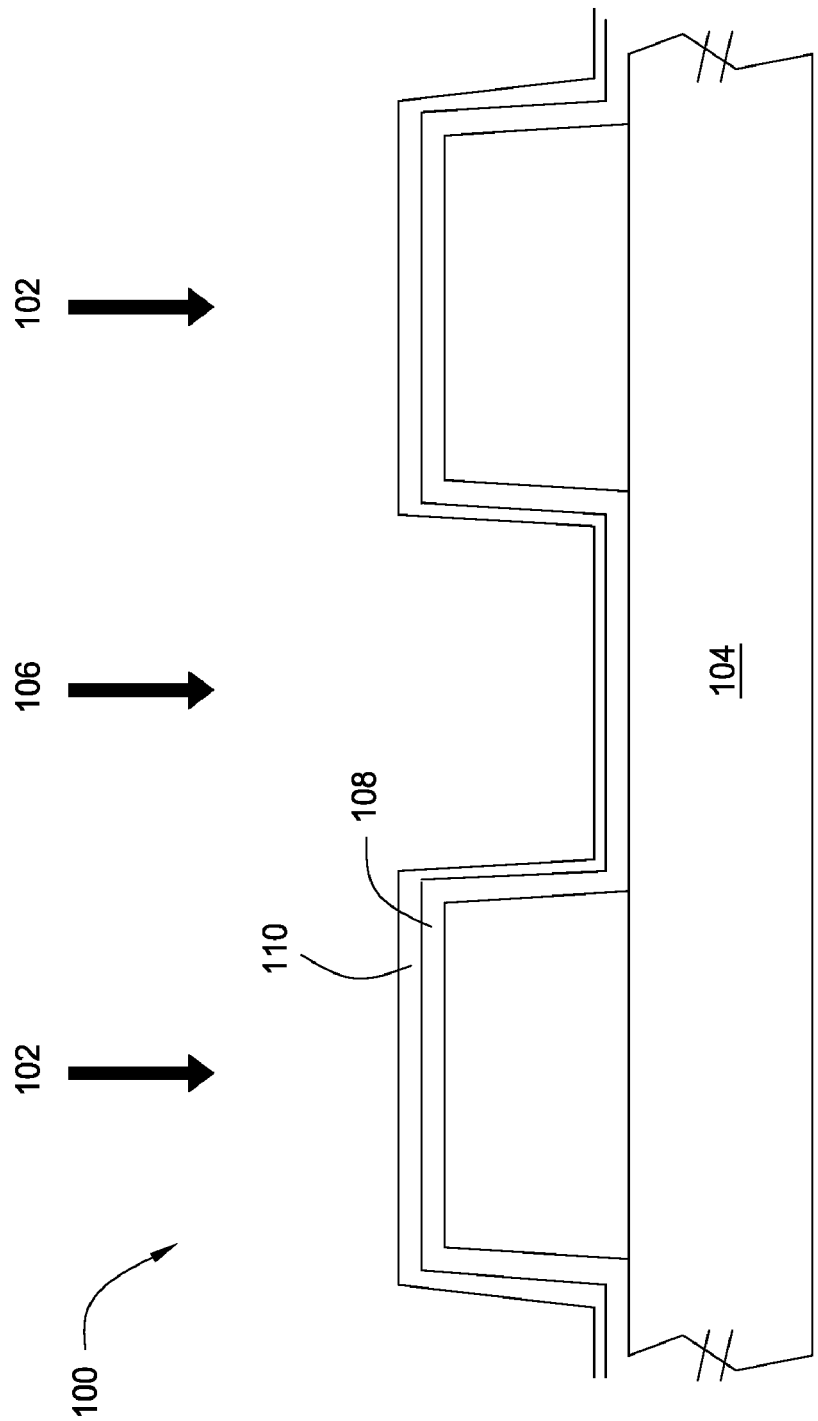

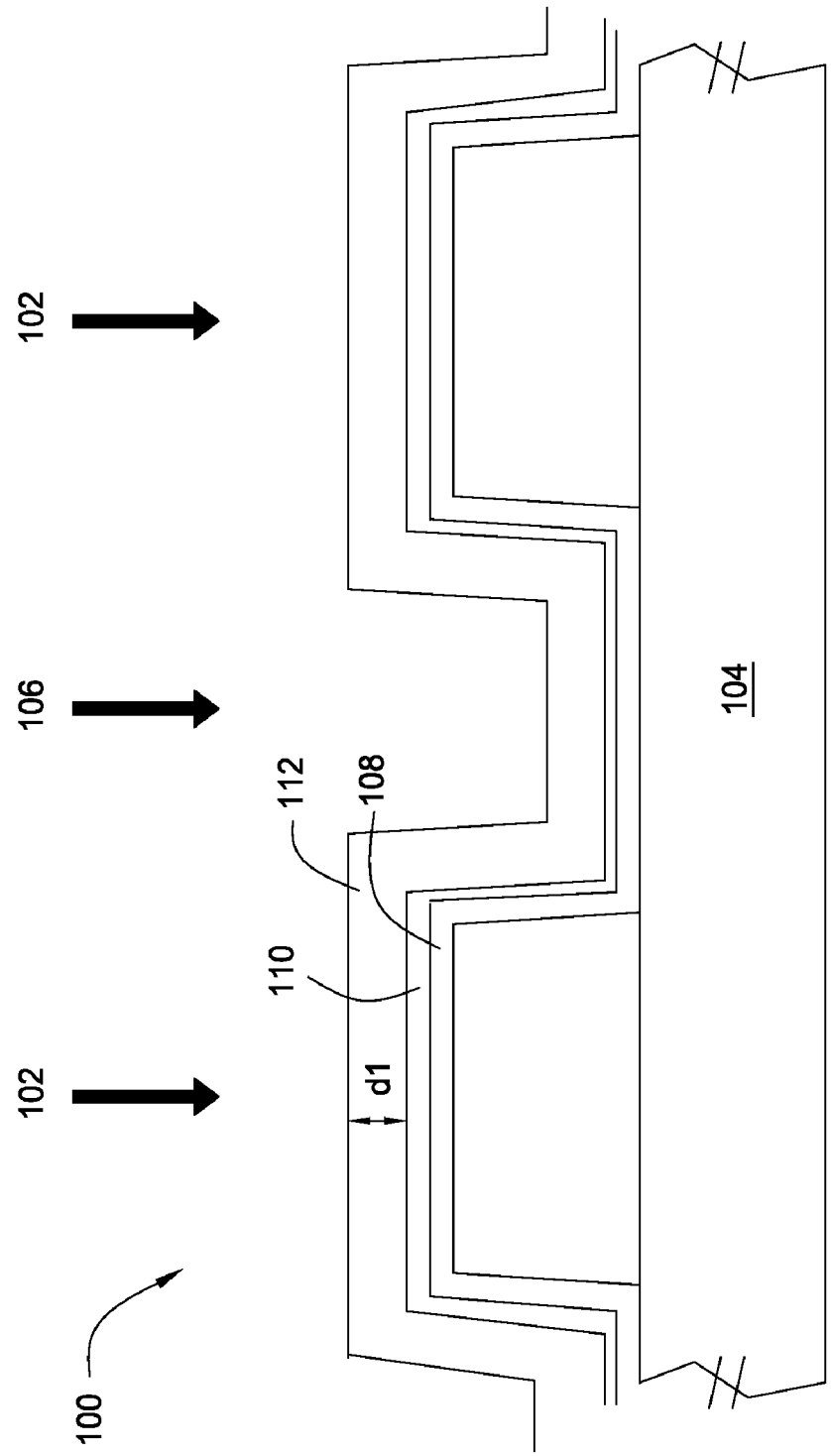

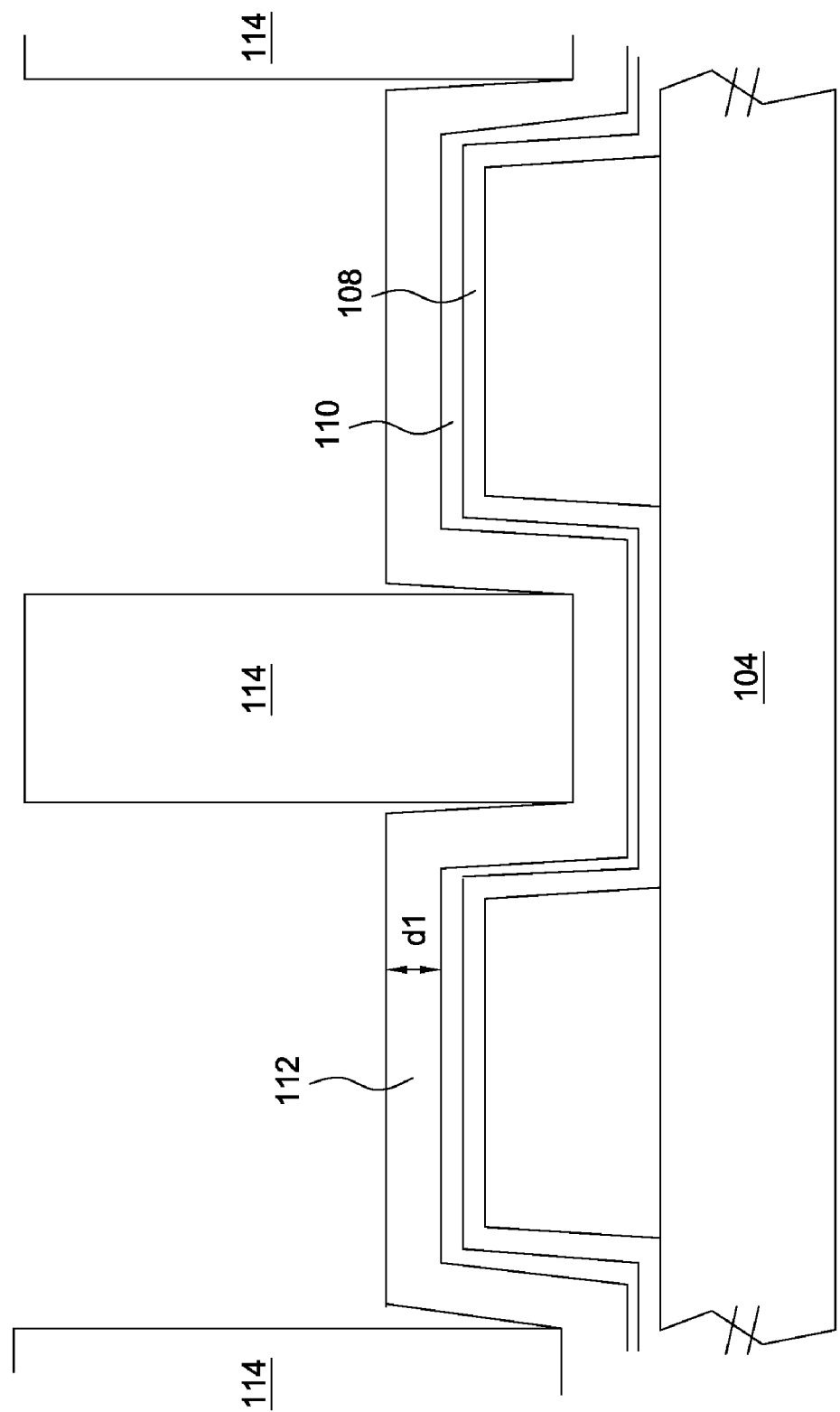

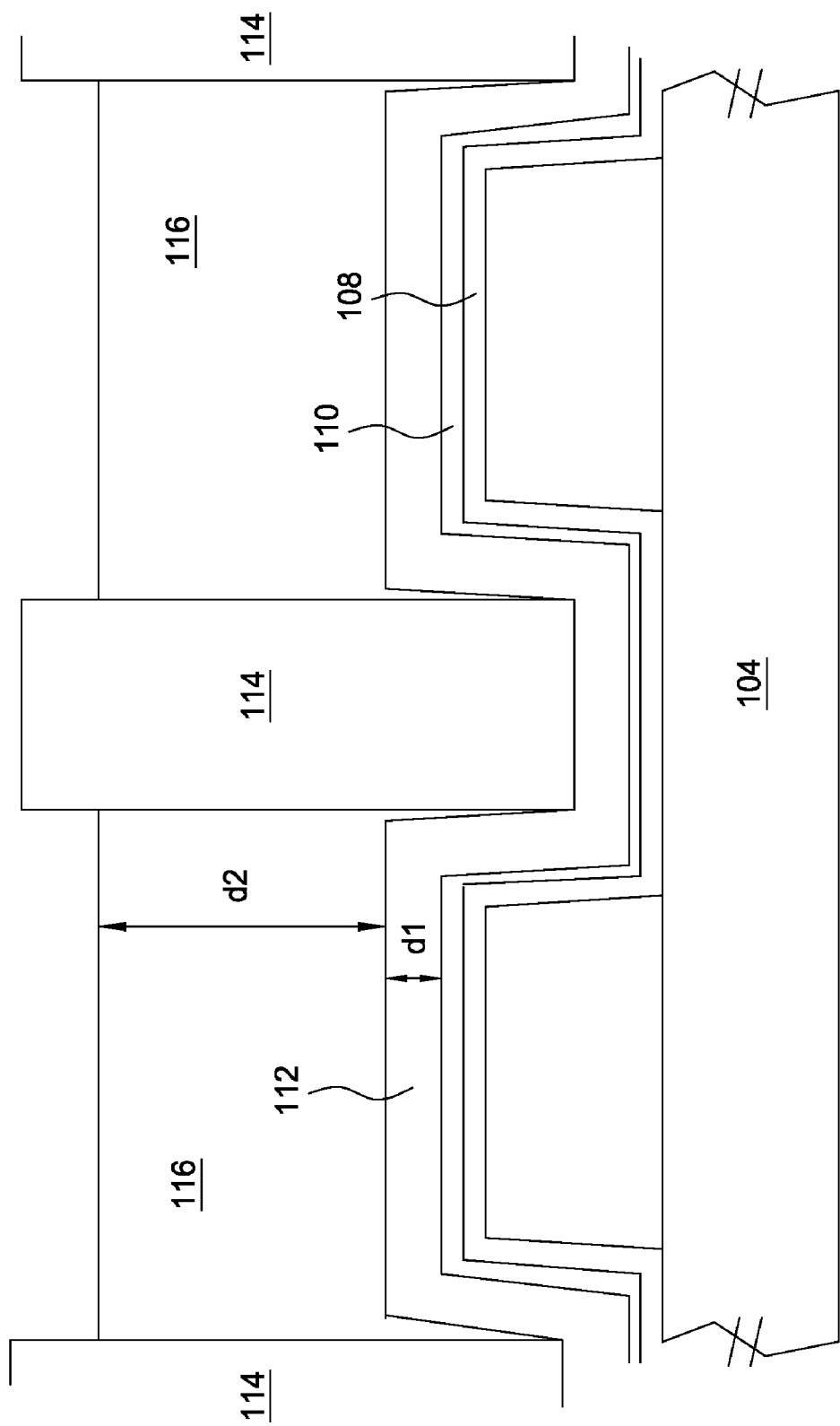

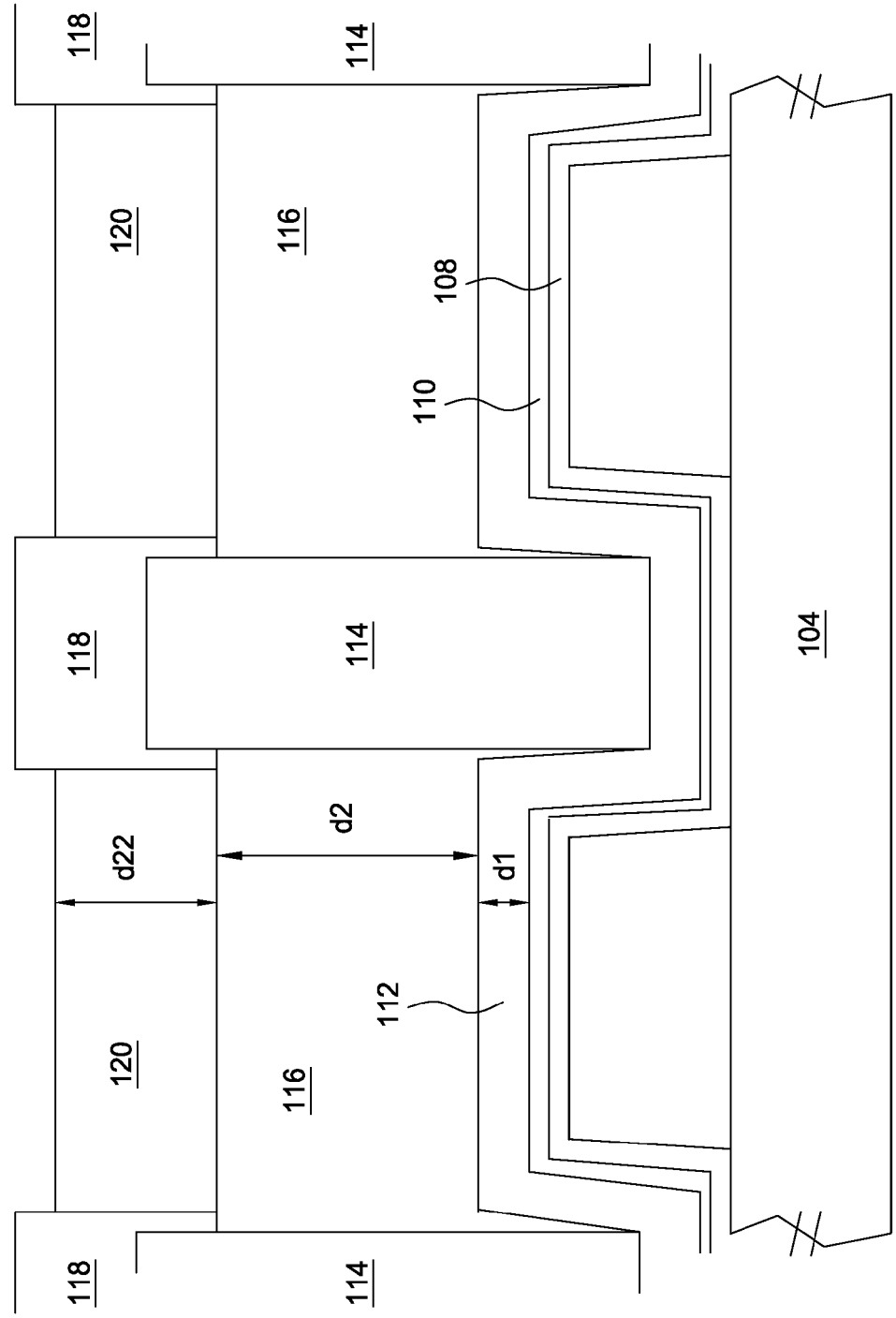

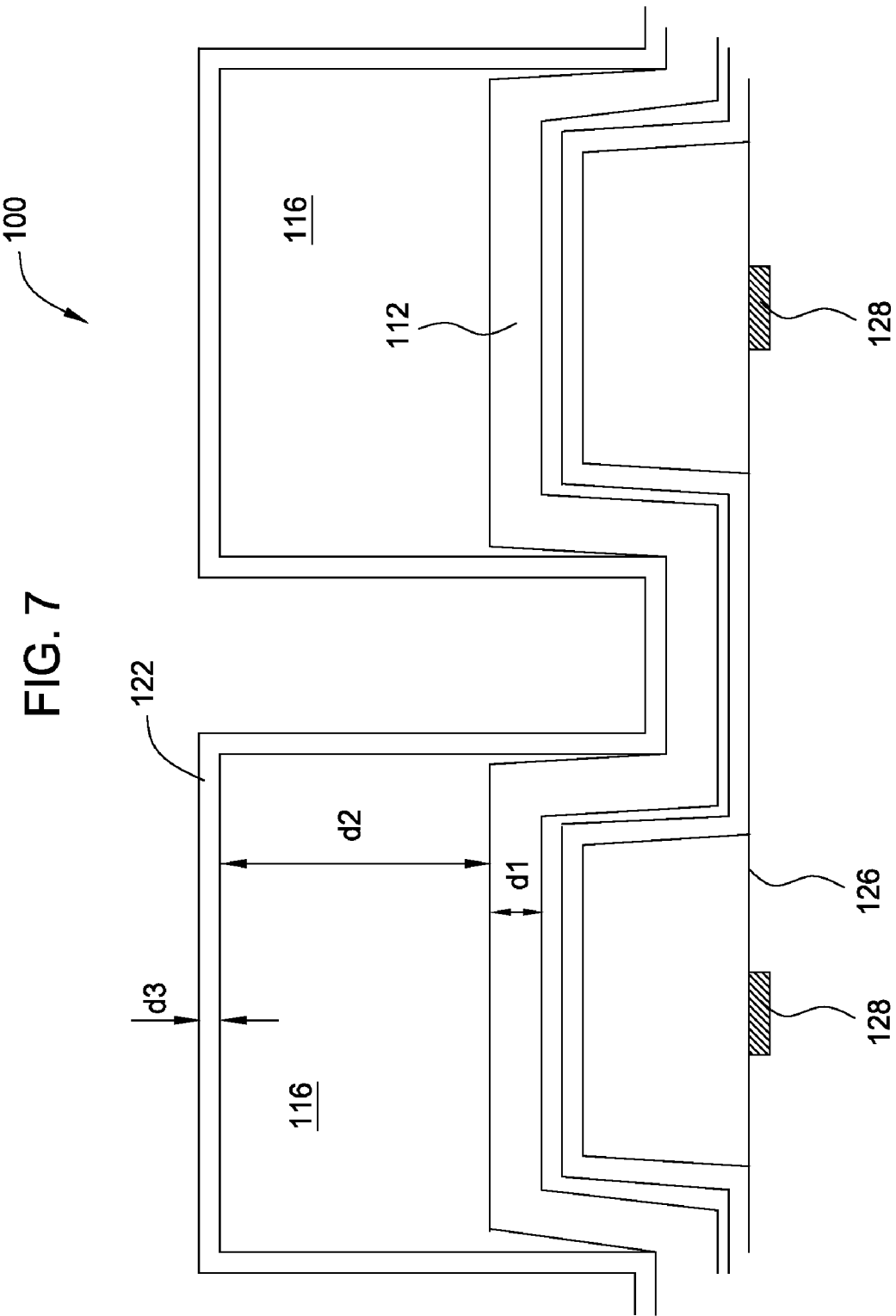

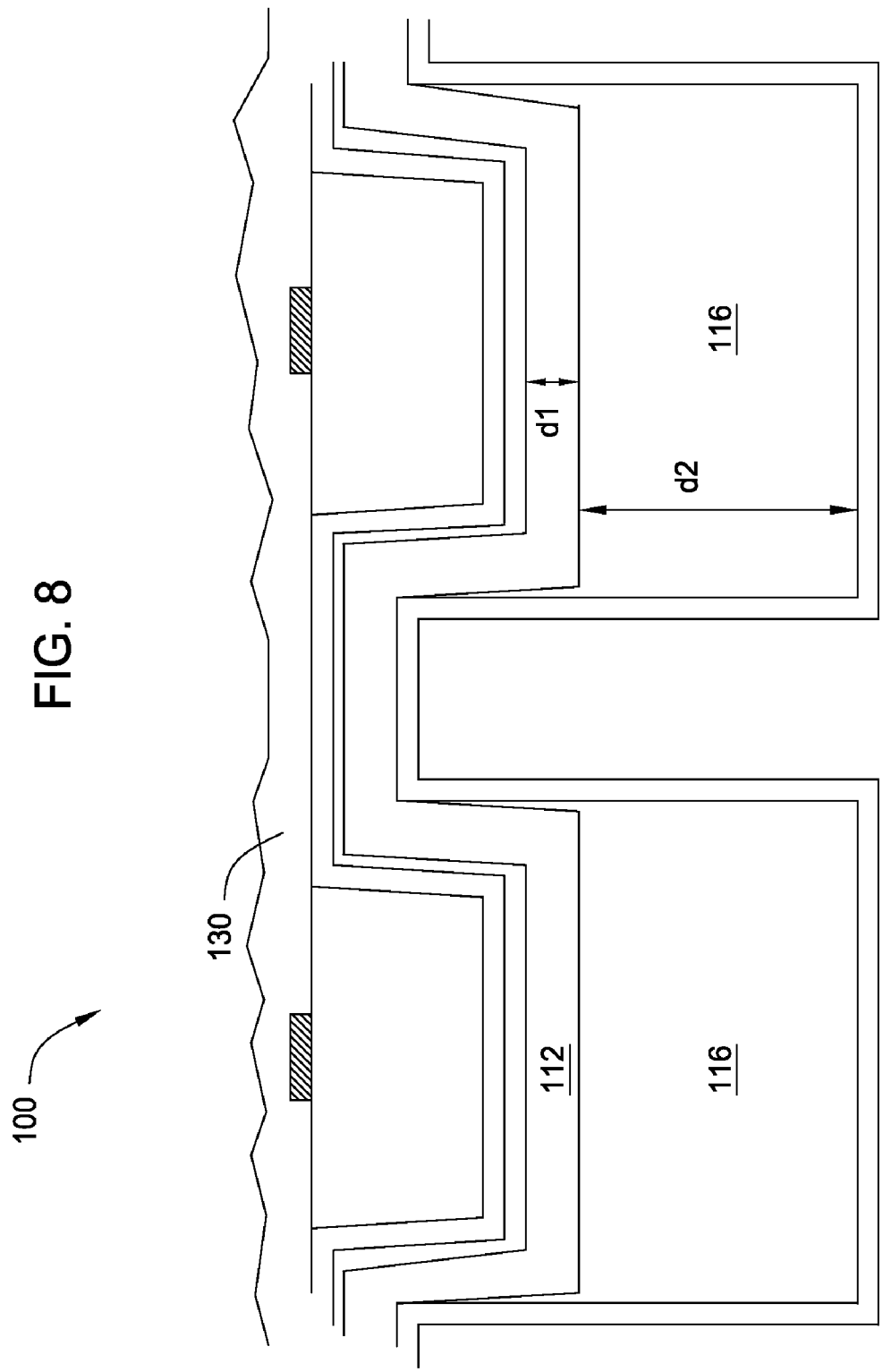

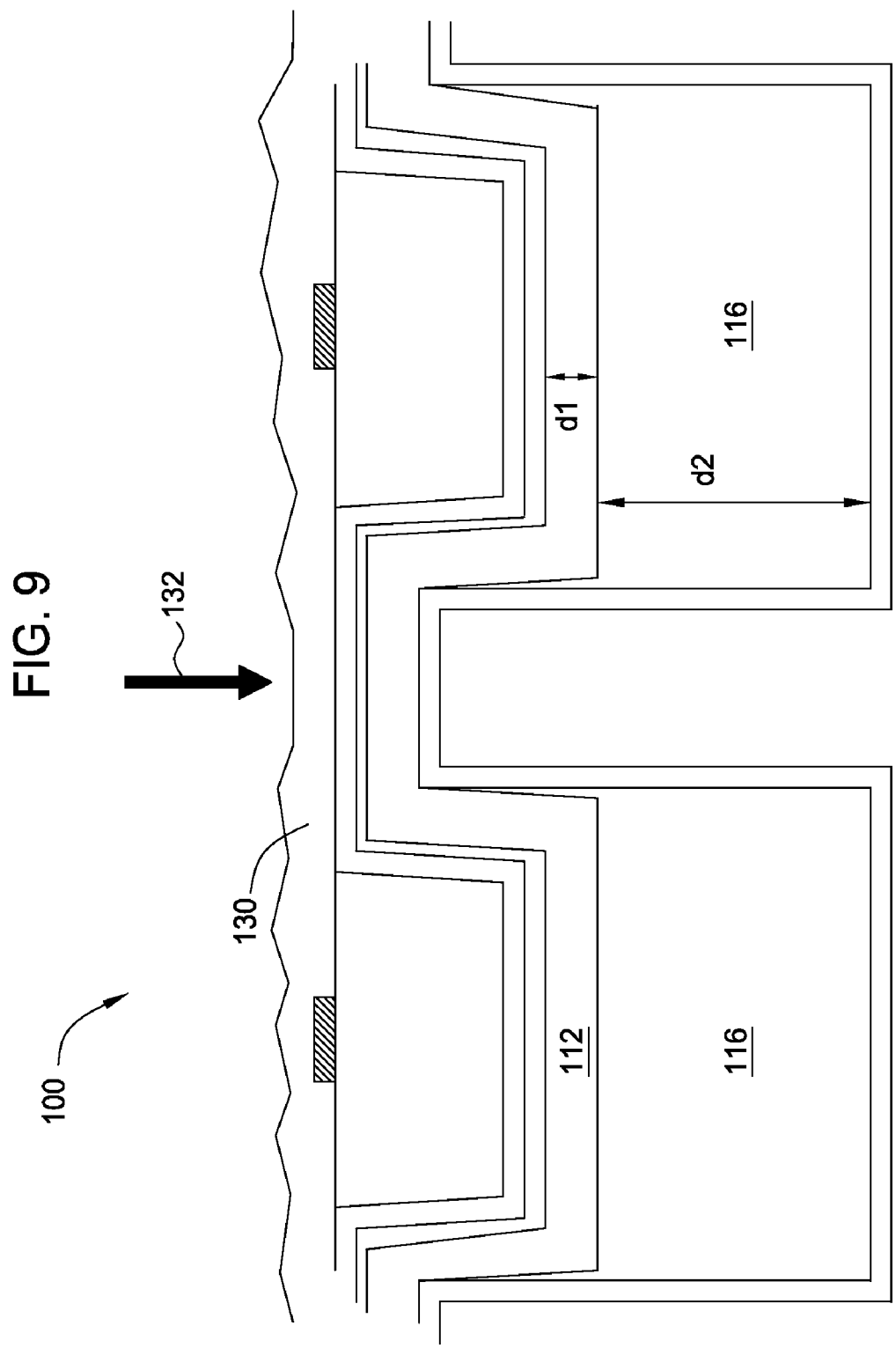

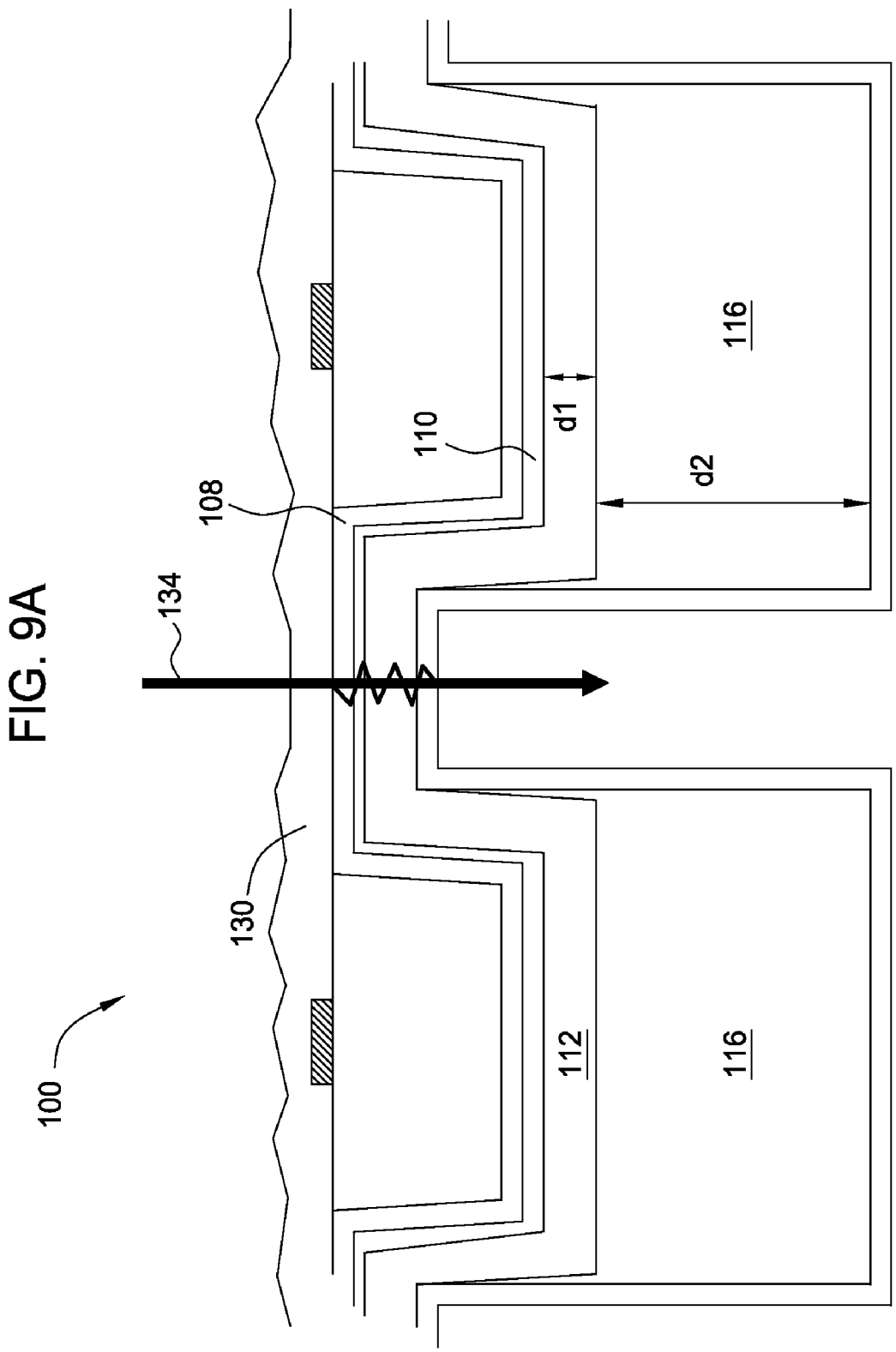

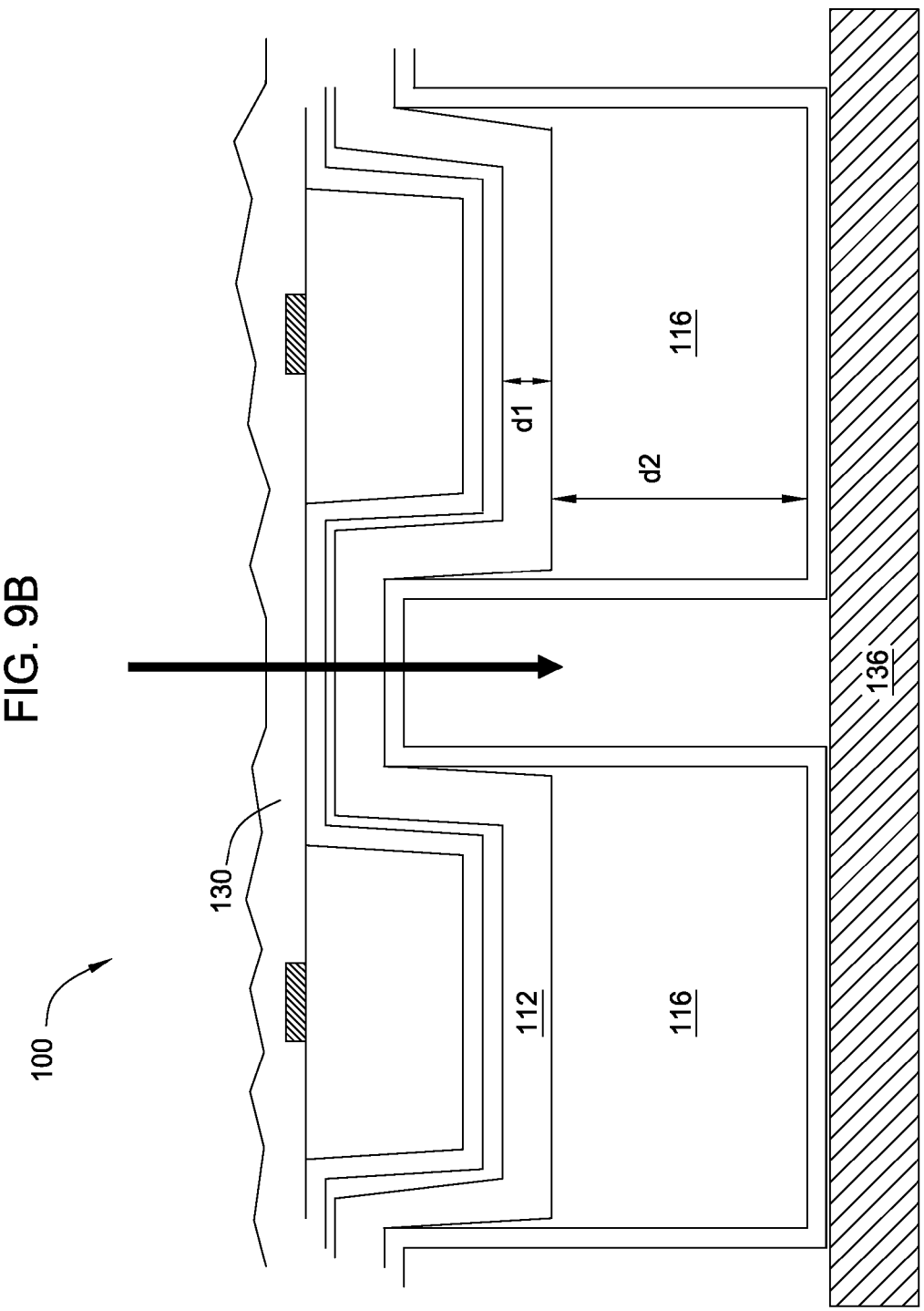

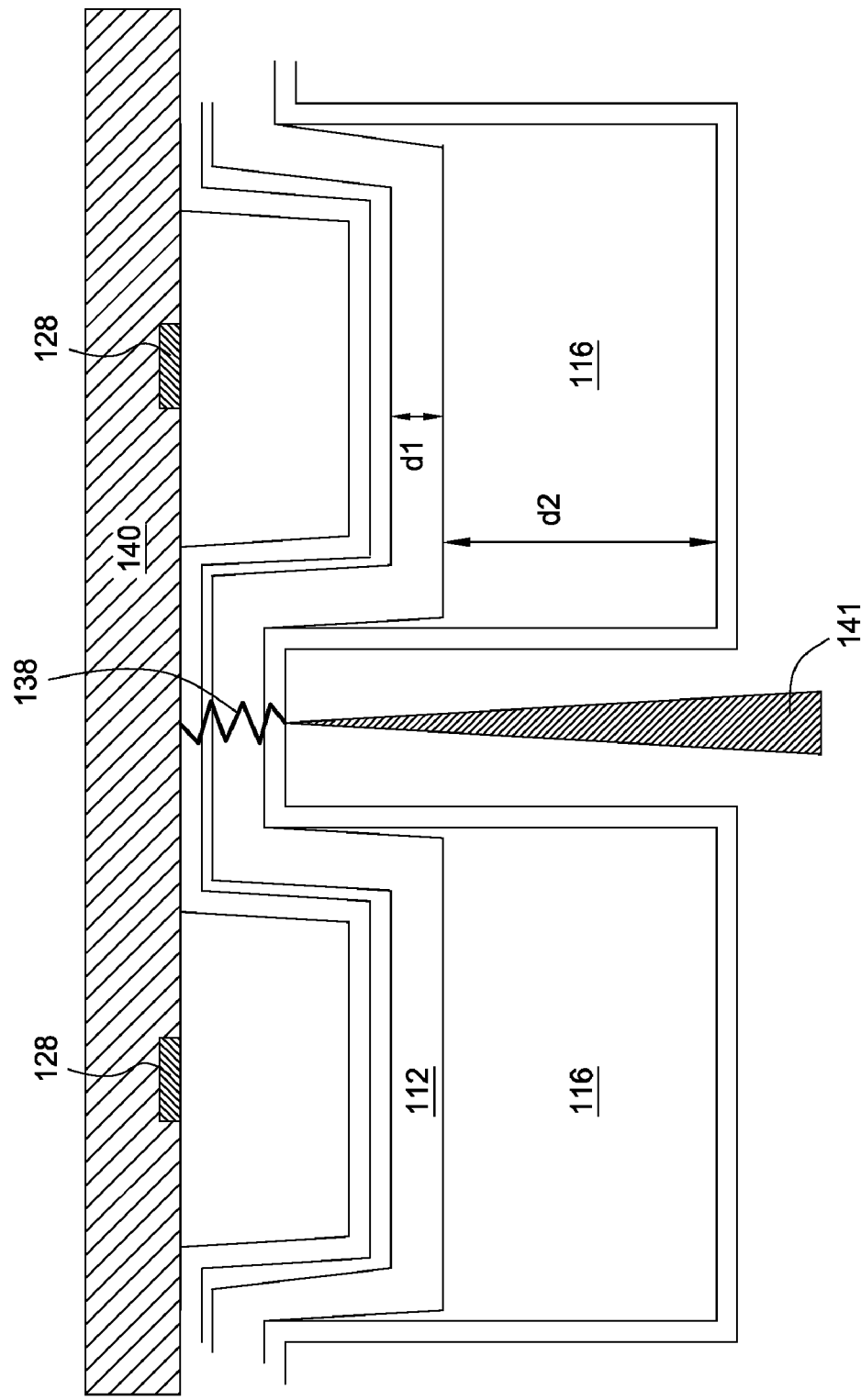

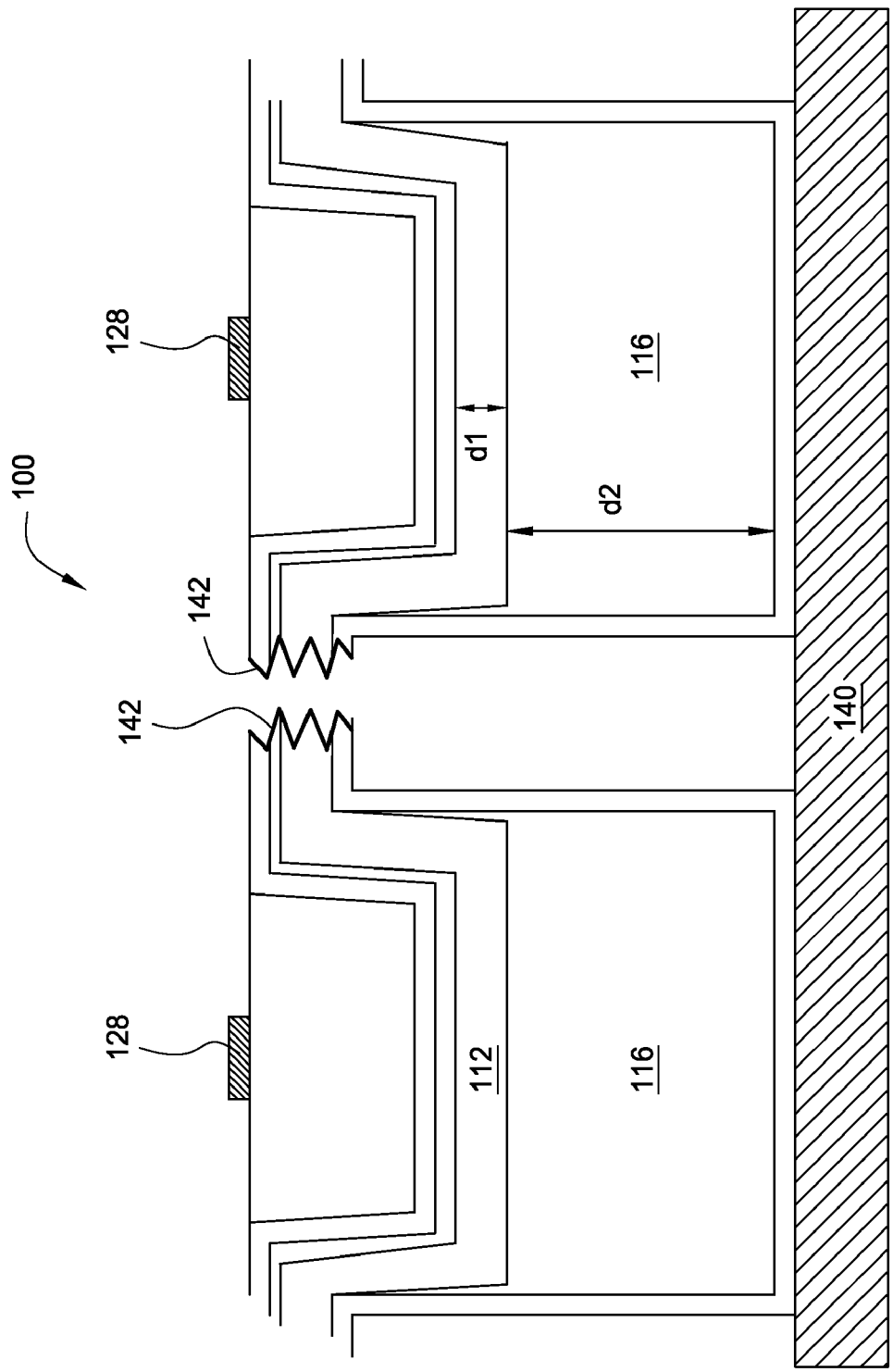

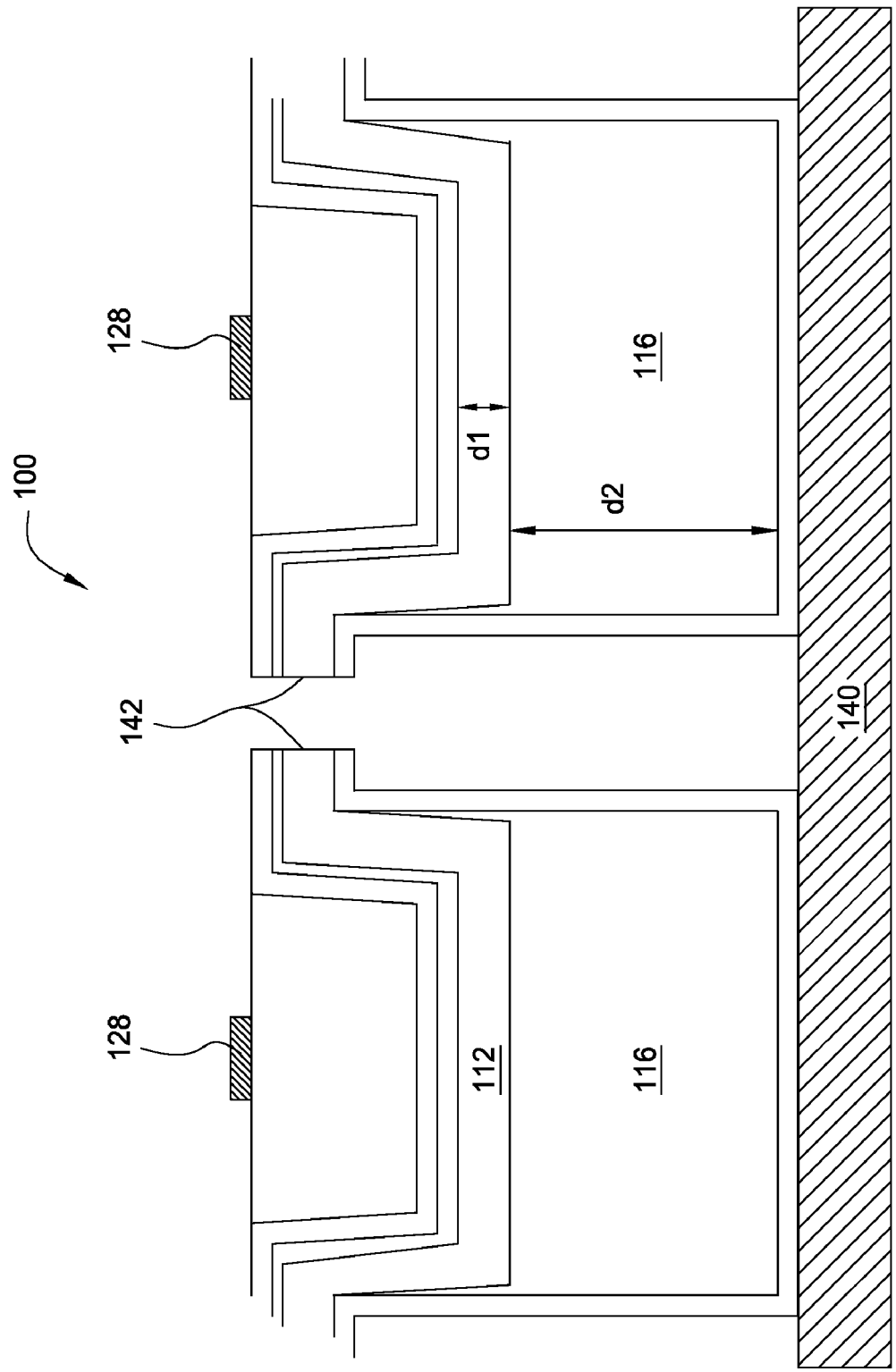

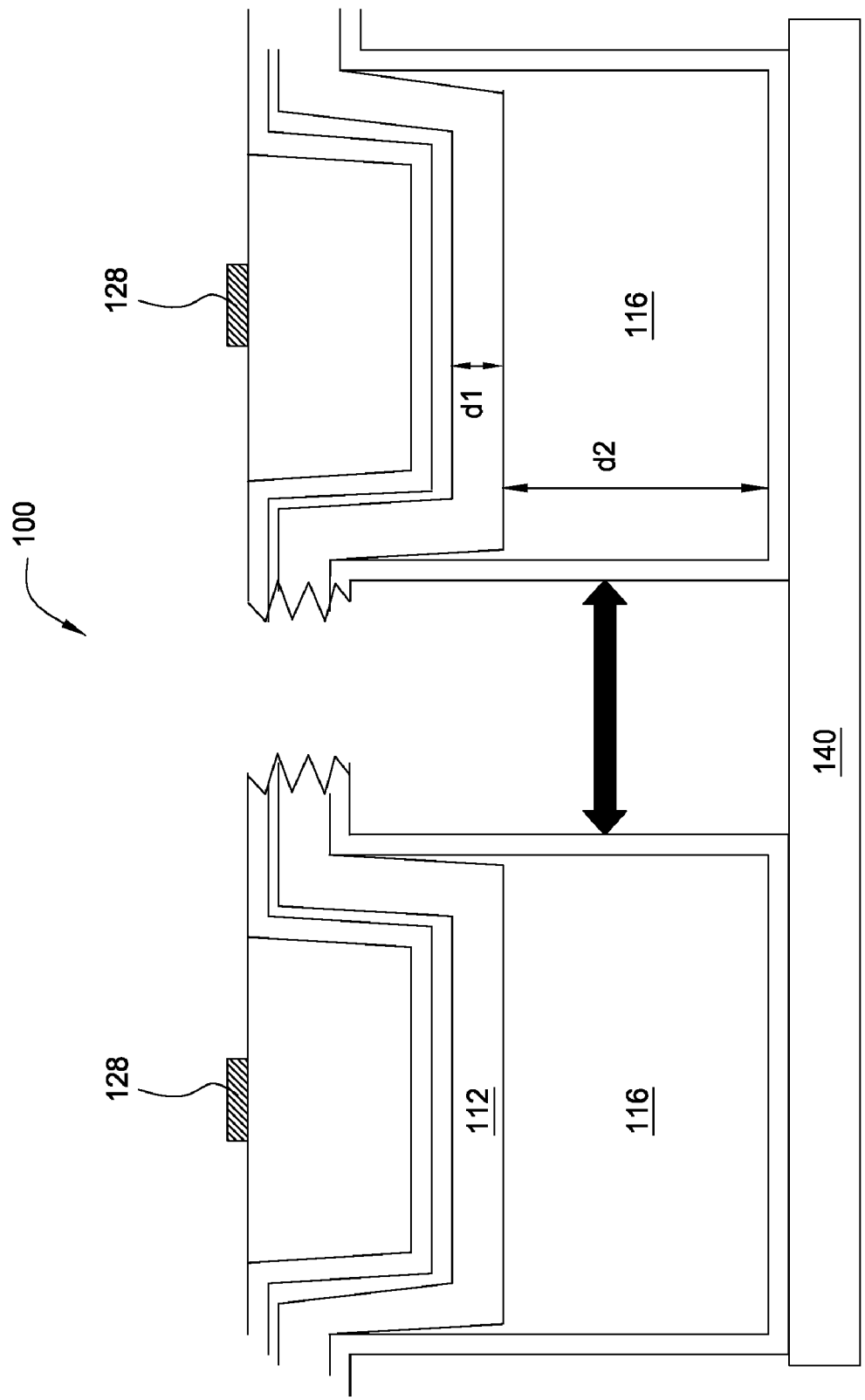

METHOD OF SEPARATING SEMICONDUCTOR DIES

CROSS-REFERENCE TO RELATED APPLICATIONS

This application claims benefit of U.S. Provisional Application Ser. No. 60/821,608 filed Aug. 7, 2006, which is herein incorporated by reference.

BACKGROUND OF THE INVENTION

1. Field of the Invention

Embodiments of the present invention generally relate to a method of semiconductor fabrication, and more particularly, to a method of separating multiple semiconductor dies.

2. Description of the Related Art

A wide variety of electronic devices, ranging from microprocessors to light-emitting diode (LED) structures, are typically formed in relatively large numbers as die on semiconductor wafer substrates. After formation, the devices must be separated for final packaging, typically via mechanical saw, "scribing and break," or laser. Conventionally, the backside of the wafer substrates is flat, and in order to separate the die, one must cut through a relatively thick substrate. Cutting through a thicker substrate generally takes more time and energy than cutting through a thinner substrate and is sometimes not possible if the substrate comprises thick metal layers that cause gumming of the saw blade or requires excessive laser energy, thereby damaging the die and lowering the manufacturing yield. However, if the substrate is made too thin, handling the delicate substrate without damage to the die may be problematic.

Furthermore in many cases, the devices must be placed on some type of structure for final assembly, such as a tape allowing manipulation of the devices by a machine, such as a robot used in automated assembly. Due to the delicate nature of the unpackaged devices, handling the devices in preparation of separation or during the separation process presents a challenge.

Accordingly, what is needed is a process to efficiently and carefully separate dies.

SUMMARY OF THE INVENTION

Embodiments of the present invention generally provide techniques and structures useful for separating multiple semiconductor dies present on a wafer. The methods described herein may provide a working semiconductor structure with enough thickness in the die area for efficient handling and satisfactory yields, but thin enough in the street areas between the dies for straightforward separation and satisfactory production throughput without a significant risk of damaging the devices.

One embodiment of the present invention is a method of fabricating a plurality of semiconductor dies. The method generally includes forming one or more semiconductor layers on a substrate; defining the plurality of semiconductor dies in the semiconductor layers such that the dies are separated by street areas; forming a thin handling structure on the semiconductor layers above the semiconductor dies and the street areas; forming a thick handling structure on the thin handling structure above the semiconductor dies, but not above the street areas; removing the substrate; and cutting through the thin handling structure in the street areas between the dies.

Another embodiment of the present invention is a method of fabricating a plurality of semiconductor dies. The method generally includes forming one or more semiconductor layers on a substrate, defining the plurality of semiconductor dies in the semiconductor layers such that the dies are separated by street areas, depositing one or more connected conductor layers above the semiconductor layers, forming one or more handling layers above the connected conductor layers, forming stop electroplating (EP) areas in the street areas, depositing a plurality of metal layers above the handling layers, wherein the stop EP areas discourage metal deposition in at least portions of the street areas, removing the stop EP areas, removing the substrate to expose a surface of the semiconductor layers, and cutting through the handling layers and the connected conductor layers in the portions of the street areas between the dies where the metal layers were not deposited.

Yet another embodiment of the present invention is a method of fabricating a plurality of semiconductor dies. The method generally includes providing a working structure having the plurality of semiconductor dies separated by street areas and disposed on a substrate; forming one or more handling layers above the plurality of semiconductor dies and the street areas; depositing one or more conductive metal layers on the handling layers above the semiconductor dies, but not above the street areas; removing the substrate from the working structure; and cutting through the handling layers in the street areas between the dies in order to separate the dies, wherein the handling layers allow for manipulation of the working structure after the substrate is removed.

Yet another embodiment of the present invention is a method of fabricating a plurality of semiconductor dies. The method generally includes providing a working structure having the plurality of semiconductor dies separated by street areas and disposed on a substrate; forming one or more handling layers above the plurality of semiconductor dies and the street areas; depositing one or more conductive metal layers on the handling layers above the semiconductor dies; removing a portion of the conductive metal layers above the street areas; removing the substrate from the working structure; and cutting through the handling layers in the street areas between the dies in order to separate the dies, wherein the handling layers allow for manipulation of the working structure after the substrate is removed.

Yet another embodiment of the present invention is a method of fabricating a plurality of semiconductor dies. The method generally includes providing a working structure having the plurality of semiconductor dies separated by street areas and disposed on a substrate; forming one or more handling layers above the plurality of semiconductor dies and the street areas; depositing one or more non-conductive layers on the handling layers above the semiconductor dies; removing a portion of the non-conductive layers above the street areas; optionally, depositing one or more continuous layers above the non-conductive layers to improve electrical or thermal conduction; removing the substrate from the working structure; and cutting through the handling layers in the street areas between the dies in order to separate the dies, wherein the handling layers allow for manipulation of the working structure after the substrate is removed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 illustrates a passivation layer added above semiconductor dies formed on a substrate in accordance with an embodiment of the present invention.

FIG. 1A illustrates portions of the passivation layer of FIG. 1 having been removed in accordance with an embodiment of the present invention.

FIG. 2 illustrates a connected conductor layer formed above the passivation layer of FIG. 1 in accordance with an embodiment of the present invention.

FIG. 3 illustrates a strong and conductive metal layer formed above the connected conductor layer of FIG. 2 in accordance with an embodiment of the present invention.

FIG. 4 illustrates a stop electroplating (EP) layer added in the streets between the dies and above the strong, conductive metal layer of FIG. 3 in accordance with an embodiment of the present invention.

FIG. 5 illustrates a conductive metal layer formed above the strong, conductive metal layer between the stop EP layer blocks of FIG. 4 in accordance with an embodiment of the present invention.

FIG. 5A illustrates an additional conductive metal layers and an additional stop EP layer added above the existing layers of FIG. 5 accordance with an embodiment of the present invention.

FIG. 7 illustrates removal of the substrate and bonding pads added to the exposed surface of the dies in FIG. 6 in accordance with an embodiment of the present invention.

FIG. 8 illustrates a protection layer formed above the exposed surface and the bonding pads of FIG. 7 in accordance with an embodiment of the present invention.

FIGS. 9, 9A, and 9B illustrate a downward force (e.g., from a laser, a saw, or a water jet) being applied to the streets of FIG. 8 in accordance with embodiments of the present invention.

FIG. 11 illustrates addition of an adhesive expandable material and a breaker, air knife, or water jet applied to the streets of FIG. 10 in accordance with an embodiment of the present invention.

FIG. 12 illustrates the result of applying the breaker, air knife, or water jet of FIG. 11 in accordance with an embodiment of the present invention.

FIG. 12A illustrates smooth cut edges of FIG. 12 after polishing, for example, in accordance with an embodiment of the present invention.

FIG. 13 illustrates separating the semiconductor dies of FIG. 12 by expanding the adhesive material in accordance with an embodiment of the present invention.

DETAILED DESCRIPTION

Figure 6:
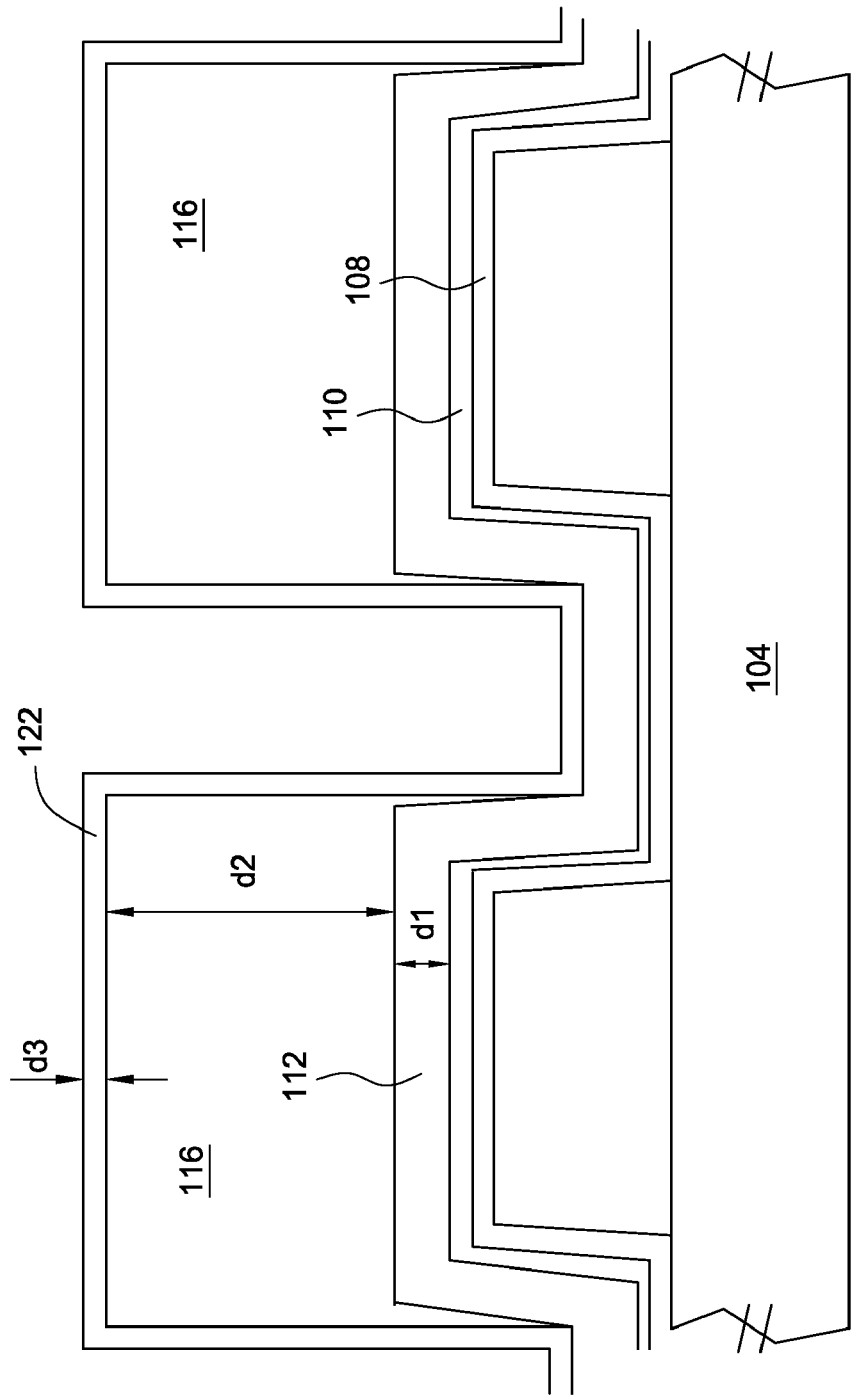
FIG. 6 illustrates removal of the stop EP layer and a barrier layer formed above the conductive metal layer and the streets of FIG. 5 in accordance with an embodiment of the present invention.

Embodiments of the present invention provide techniques and structures useful for separating multiple semiconductor dies present on a wafer. This method may be applied to any semiconductor wafer with multiple dies, and the case of separating multiple vertical light-emitting diode (VLED) dies is provided as a particular, but not limiting, example. In the figures that follow, only two dies are shown, but this is representative of multiple dies on the entire wafer.

An Exemplary Die Separation Method

Referring now to FIG. 1, a generic multilayered semiconductor structure 100 may be provided with two or more different dies 102 disposed on a substrate 104 and separated by a street section, or simply "the street" 106. The dies may have been epitaxially deposited on the substrate, which may be composed of any suitable material, such as $SiO_2$, sapphire, GaAs, InP, InGaAsP, Si, ZnO, or AlN. A passivation layer 108 may be deposited on the dies 102. A portion of the passivation layer may be removed as required (e.g., for contact or grounding) as shown in FIG. 1A by any suitable technique, such as etching with a mask.

After one or more passivation layers 108 have been added with a portion of the passivation layers removed as required, a connected conductor 110 may be deposited using any of several suitable techniques including physical vapor deposition (PVD), evaporation, plasma spray, chemical vapor deposition (CVD), or electrolysis deposition to cover the entire structure of FIG. 1 (as illustrated in FIG. 2). From this connected conductor 110, additional metal layers may be formed above in an effort to further protect the underlying layers. In multilayered implementations, the individual metal layers may be composed of different metals, be formed using different techniques, and possess different thicknesses.

A strong and conductive metal layer 112 having a thickness d1 may be formed above the connected conductor 110 as shown in FIG. 3 using any suitable technique, such as electroplating (EP), electrolysis plating, or metal bonding on the whole wafer. The strong, conductive metal layer 112 may be formed across the street 106 in an effort to connect the dies 102 for handling. The strong, conductive metal layer 112 may comprise a single layer or multiple layers, consisting of one or more metal elements or metal alloys in either case. Possibilities of composition materials for this handling layer 112 may include Cu, Ni, Mo, W, Co, Pd, Pt, Ni—Co, Ag, Au, Cu—Co, Cu—Mo, Cu/Ni, Cu/Ni—Co, Cu/Ni—Co/Cu, Cu/Ni—Co/Cu/Ni—Co, and Cu/Ni/Cu—Mo or their alloys. For example, the strong, conductive metal layer 112 may contain a first layer of copper, a second layer of nickel-cobalt, and a third layer of copper (Cu/NiCo/Cu). As another example, the strong, conductive layer 112 may comprise a first layer of copper, a second layer of nickel, a third layer of gold, and subsequent layers that repeat this structure (e.g., Cu/Ni/Au/Cu/Ni/Au).

The hardness of the strong, conductive layer 112 is typically greater than 100 HV, where HV is the Vickers Hardness, and may, for some embodiments, lay within the range 100 to 1000 HV. The thickness d1 is typically greater than 1 μm; however the particular thickness selected for any given application may depend on the hardness of the metal or metal alloys used. For example, if a metal with a hardness of 120 HV is used, layer 112 may have a thickness d1 of approximately 40 μm, while if a metal (alloy) with a hardness of 500 HV is used, layer 112 may have a thickness d1 of only 20 μm. For some embodiments (e.g., where the strong, conductive metal layer 112 is not deposited by electroplating), the strong, conductive metal layer 112 may be deposited directly above the passivation layers 108 and the dies 102 such that deposition of a separate connected conductor 110 is not required.

Once the strong, conductive layer 112 has been created, a mass of material that resists electroplating, the stop electroplating (EP) layer 114, may be formed using a mask, for example, and may be positioned only above the street 106 as shown in FIG. 4. In this manner, the stop EP layer 114 may block the further growth of metal on the street 106 during subsequent depositions. The stop EP layer 114 may be composed of a non-conductive material and may be photosensitive or non-photosensitive. Suitable material for the stop EP layer 114 may include a polymer, a polyimide, epoxy, a resist, thermoplastic, a parylene, a dry film resist, SU-8, or NR7. The thickness of the stop EP layer 114 is typically greater than 1 μm.

Electroplating or electrolysis plating may then be used to further grow a metal substrate for heat dissipation with the addition of a conductive metal layer 116 having a thickness d2 and disposed above the semiconductor structure 100 as shown in FIG. 5. By providing thick metal layers only above the dies 102 with the assistance of the stop EP layer 114, the conductive metal layer 116 may also aid handling of the working structure 100 without impeding the subsequent separation process. By discouraging further deposition of metal or metal alloy layer(s) in the street 106, the stop EP layer 114 may ensure the metal in the area between the dies 102 is relatively thin for efficient and unproblematic separation.

The conductive metal layer 116 may comprise a single layer or multiple layers, consisting of one or more metal elements or metal alloys, such as Cu, Ni, Ag, Au, Al, Cu—Co, Ni—Co, Cu—W, Cu—Mo, Ni/Cu, and Ni/Cu—Mo, in either case. The thickness d2 of the conductive metal layer 116 may be greater than 1 μm, but should be controlled so that the conductive metal layer 116 on top of one die is not electrically connected to the conductive metal layer 116 disposed above another die. The thickness d2 may lie within a range of about 5 to 700 μm. It may be desirable to form a thicker metal substrate by forming additional stop EP layers 118 and additional conductive metal layers 120 having a thickness d22 above the initially formed conductive metal layer 116 as illustrated in FIG. 5A. For some embodiments where the semiconductor dies 102 do not have a metal substrate, the formation of the stop EP layers 114 and the deposition of the conductive metal layer 116 may not be performed.

Referring to FIG. 6, the stop EP layer 114 may be eradicated using, for example, wet etching. An optional barrier layer 122, which may comprise a single layer or multiple formed layers, may then be formed covering the total area of the conductive metal layer 116 and the street 106 in an effort to protect the backside of the dies 102 and increase the hardness of the street 106. By sandwiching the conductive metal layer 116 of each die 102 against the strong and conductive metal layer 112, the barrier layer 122 may also decrease the stress on and improve the handling capabilities of the working structure 100 compared to embodiments without the barrier layer 122. The thickness d3 of barrier layer 122 may be greater than 100 Å. The barrier layer 122 may be a conductor (e.g., Cr/Au, Ni/Au, Ti/Au, Al/Ti, Ag/Ti, Cr/Au/Ti/Ni/Au, Ti/Ni/Au, Ni—Co/Au, W/Au, Mo/Au), semiconductor (e.g., Si, GaAs, GaP, InP), or insulator (e.g., a polymer, a polyimide, a parylene, epoxy, resist, a dry film resist, thermoplastic, $SiO_2$, $Si_3N_4$, ZnO, $Ta_2O_5$, $TiO_2$, HfO, MgO). The purposes of the barrier layer 122 will be described in further detail below.

After formation of the barrier layer 122, the substrate 104 may subsequently be removed as illustrated in FIG. 7. Removal may be accomplished by any suitable technique or combinations thereof, such as plasma etching, wet chemical etching, photo-enhanced chemical etching, laser lift-off, grinding, or polishing. Once the substrate 104 has been removed, the bottom surface 126 of the working structure 100 should be exposed and may be operated on. For example, bonding pads 128 and/or any desired circuit patterns on the remaining semiconductor material may then be fabricated on the underside of the working structure.

As illustrated in FIG. 8, the surface of the semiconductor structure 100 with patterning and bonding pads 128 may be protected by a protection layer 130 in an effort to avoid contamination from the die separation, especially with embodiments involving cutting. The protection layer 130 may comprise a combination of suitable protective materials (e.g., wax, epoxy, a polymer, thermoplastic, a polyimide, a parylene, resist, $SiO_2$, $Si_3N_4$, ZnO, $Ta_2O_5$, $TiO_2$, HfO, or MgO), and the thickness of the protection layer 130 is typically greater than 100 Å.

The working structure 100 may be diced (i.e., separated into individual integrated circuits (ICs)) using various steps, each of which will be now discussed. In these steps, methods to separate the ICs may include a breaker, an air knife, and/or a water jet with a chemical solution (for coating the anti-oxidizing material on the cut edge of the strong, conductive metal layer 112).

In the first separation step, the working structure 100 (e.g., a wafer) having dies 102 fabricated thereon may be separated by laser cut, saw cut, or water jet processes. This is represented by a downward force 132 seen in FIG. 9, although those skilled in the art will recognize that the force 132 may be applied from either the top or the bottom of the structure 100. After a laser 134 has been used to cut through the passivation layer 108, the connected conductor 110, the strong and conductive metal layer 112, and/or the barrier layer 122, the strong and conductive metal layer 112 and the barrier layer 122 may be merged together by laser heating as seen in FIG. 9A. The use of a saw cut or water jet to cut through the area of the street 106 is shown in FIG. 9B. A temporary adhesive layer 136 may be used to hold the dies 102 together after cutting.

Figure 10:
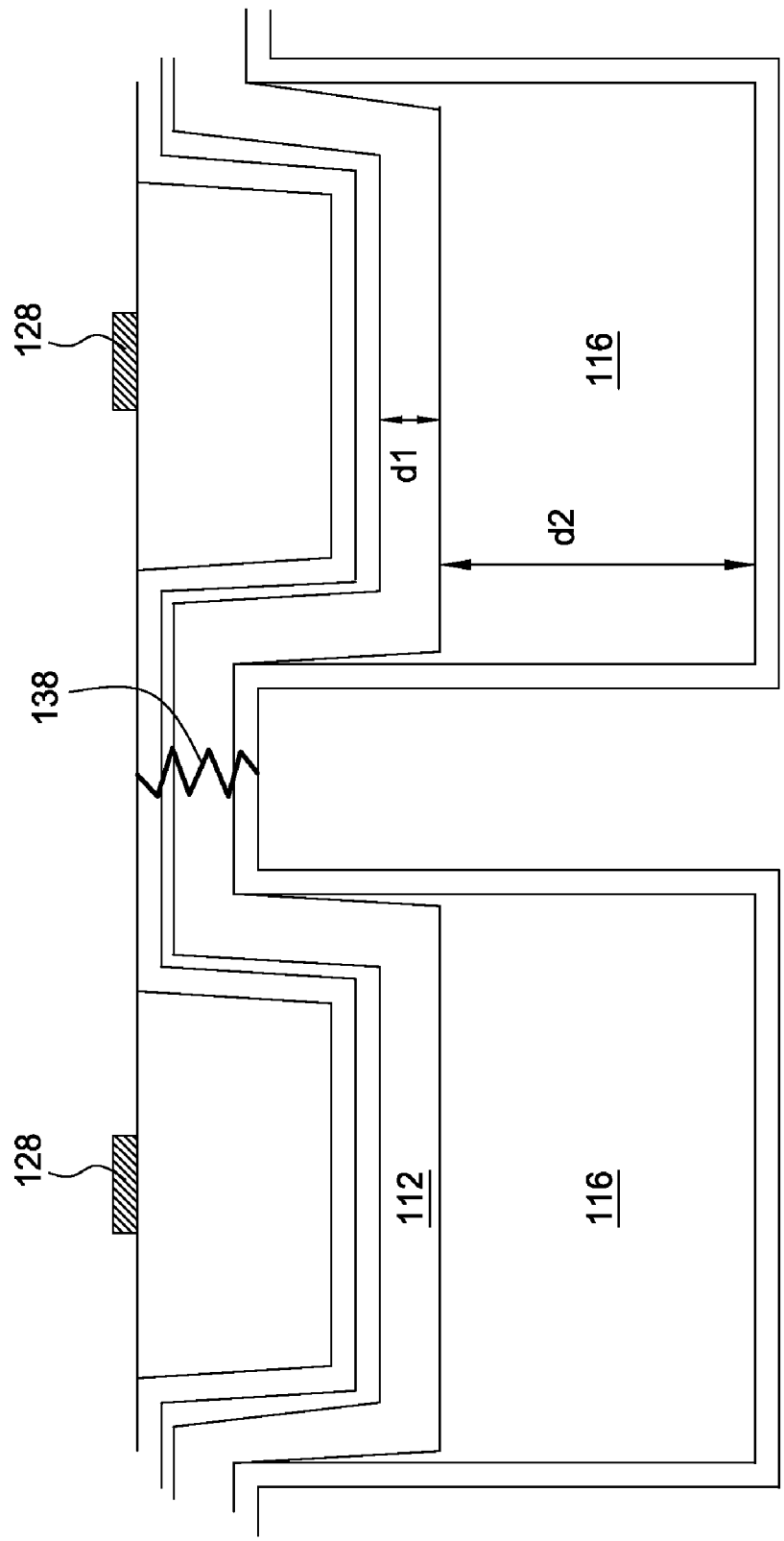
FIG. 10 illustrates merged metal layers from laser cutting and removal of the protection layer from FIG. 9 in accordance with an embodiment of the present invention.

Dies are disposed on the wafer, and the whole wafer after laser cutting can be handled because of the strong and hard merged metal 138 of at least layer 112 in the street 106 as shown in FIG. 10. The protection layer 130 may be removed by any suitable technique, such as wet etching or inductively coupled plasma with reactive ion etching (ICP/RIE). The contamination from die cutting may also be cleaned or cleared away with the removal of the protection layer.

After removal of the protection layer 130, the whole wafer with dies may be added onto an adhesive expandable material 140. Placed on the top and/or bottom of the wafer, this adhesive expandable material 140 is usually a type of tape, and may comprise ultraviolet-curable (UV) or metal tape. The methods to separate the ICs include a breaker 141, air knife, and/or water jet with chemical solution (for coating the anti-oxidizing material on the cut edge of the strong, conductive metal layer 112) to break the merged metal layer(s) 138 in the area of the street 106 as illustrated in FIG. 11.

The result for some embodiments showing separated dies can be seen in FIG. 12 after the structure 100 is flipped over. For other embodiments as shown in FIG. 12A, the cut edges 142 may be polished or grinded in an effort to smooth these surfaces. Each separated die may have a metal substrate in the center of the die composed of the strong and conductive metal layer 112, the conductive metal layer 116, and the optional barrier layer 122. The edges of the separated die may not comprise the conductive metal layer 116 such that the edges may only contain the passivation layer 108, the connected conductor 110, the strong and conductive metal layer 112, and the optional barrier layer 122.

To achieve a desired separation distance, the adhesive expandable material 140 may be optionally expanded in an effort to further separate the semiconductor dies 102 as illustrated in FIG. 13.

An Exemplary VLED Die Separation Method

Now that one embodiment of the present invention has been described, a similar separation method as disclosed herein will be applied to a wafer having multiple vertical light-emitting diode (VLED) dies as a particular, but not limiting, application example.

Figure 14:
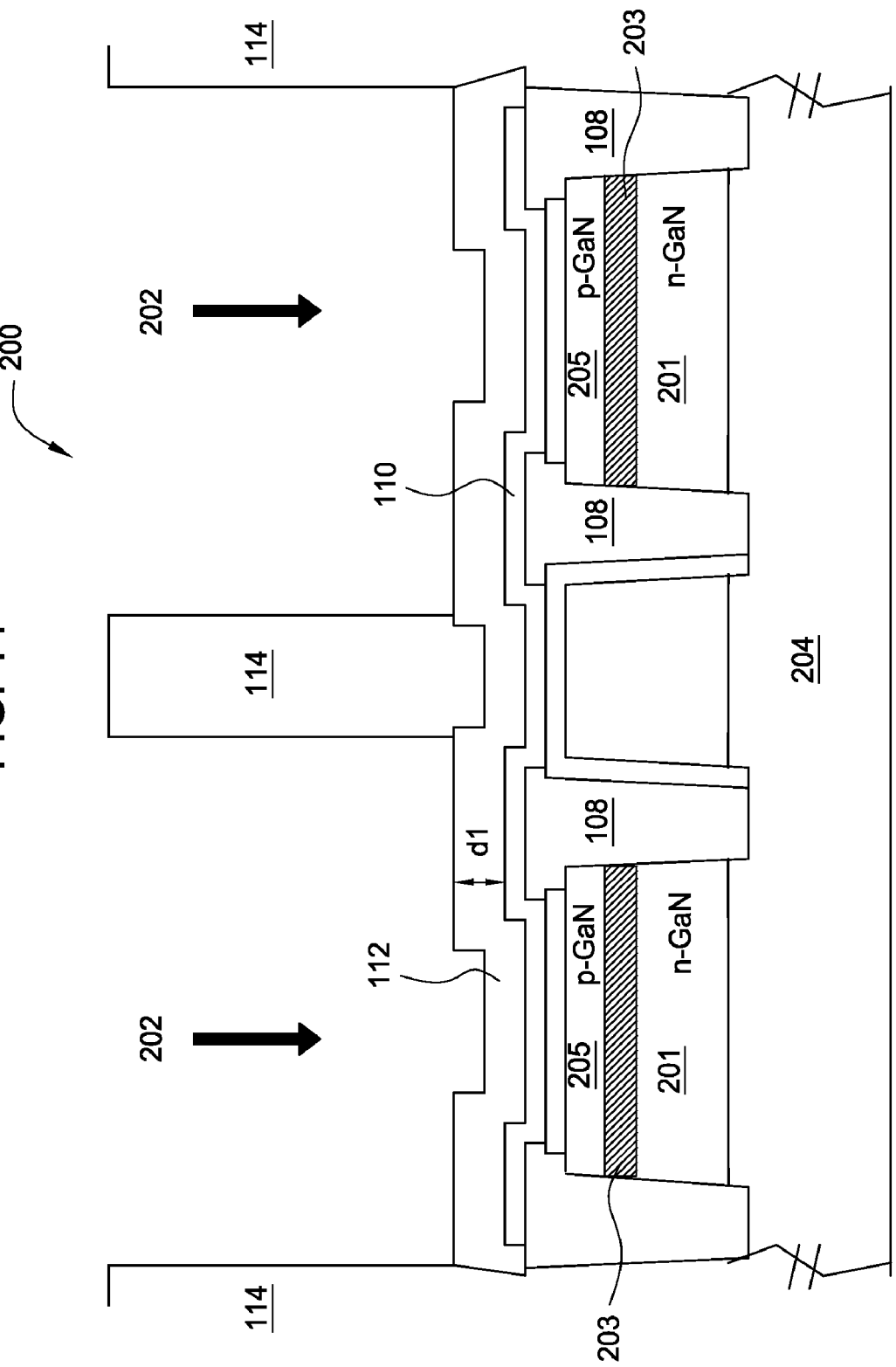
FIG. 14 illustrates two vertical light-emitting diode (VLED) dies disposed on a carrier substrate with a strong and conductive metal layer and a stop EP layer disposed above the VLED dies in accordance with an embodiment of the present invention.

Referring to FIG. 14, a multilayered epitaxial structure 200 may be provided having two vertical gallium nitride (GaN) p-n junctions referred to as VLED dies 202 that have been grown on a carrier substrate 204, which may be composed of sapphire. Although GaN p-n junctions are described as an example, the VLED dies may alternatively be composed of AlN, InN, AlGaN, InGaN, or AlGaInN. The VLED dies 202 may comprise an n-doped GaN (n-GaN) layer 201 deposited on the carrier substrate 204, an active region 203 for emitting light deposited on the n-GaN layer 201, and a p-doped GaN (p-GaN) layer 205 deposited on the active region 203. These two VLED dies 202 may be separated by a street 106.

A strong and conductive metal layer 112 having a thickness d1 may be formed using electroplating, electrolysis plating, or metal bonding on a surface of the whole wafer. The strong, conductive metal layer 112 may comprise a single layer or multiple layers, consisting of one or more metal elements or metal alloys in either case. Possibilities of composition materials for layer 112 may include Cu, Ni, Mo, W, Co, Pd, Pt, Ni—Co, Ag, Au, Cu—Co, Cu—Mo, Cu/Ni, Cu/Ni—Co, Cu/Ni—Co/Cu, Cu/Ni—Co/Cu/Ni—Co, and Cu/Ni/Cu—Mo or their alloys. One purpose of forming the strong, conductive metal layer 112 across the street 106 may be to connect and mechanically support the dies 202 for handling. The thickness d1 is typically greater than 1 μm and may depend on the hardness of the composition materials for metal layer 112 as described above.

Once strong, conductive metal layer 112 has been created, a mass of material that resists electroplating, the stop EP layer 114, may be formed using a mask and may be positioned only above the street 106 as shown. In this manner, the stop EP layer may block the growth of metal on the street. The thickness of the stop EP layer 114 is typically greater than 1 μm.

Figure 15:
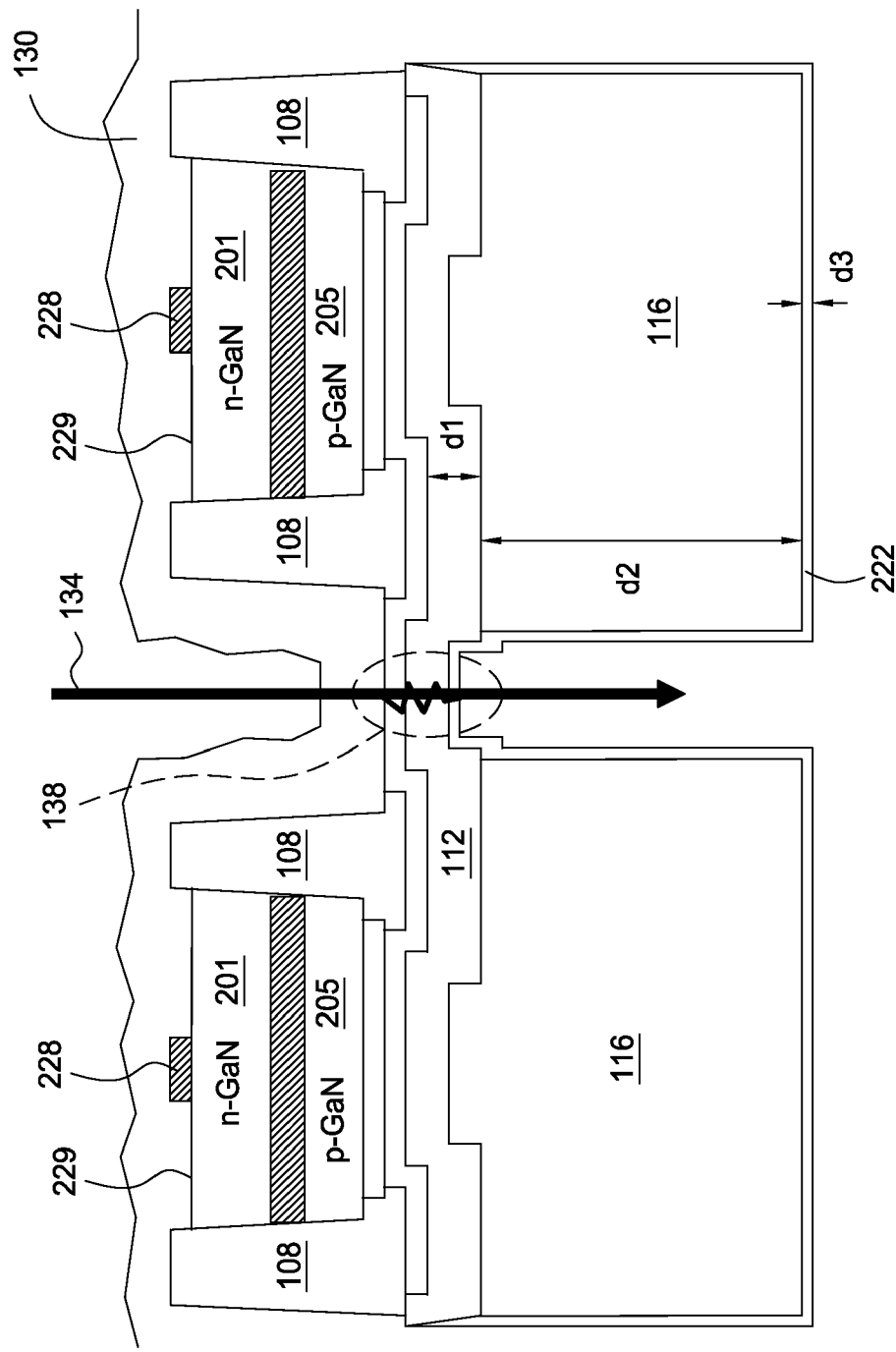
FIG. 15 illustrates a conductive metal layer and a conductive passivation layer formed above the strong, conductive metal layer, removal of the stop EP layer and the substrate, bonding pads and a protection layer formed above the exposed surface, and laser cutting the streets with merging of the metal layers of FIG. 14 in accordance with an embodiment of the present invention.

Referring now to FIG. 15, additional layers of a metal substrate, such as the conductive metal layer 116 with thickness of d2, may be created above the semiconductor structure 200; the stop EP layer 114 may be eradicated; a conductive passivation layer 222 having thickness d3 may be absent or may be formed covering the total area of the conductive metal layer 116 and the street 106 in an effort to protect the backside of the VLED dies 202 and increase the hardness of the street 106; the carrier substrate 204 and any other materials in the street 106 may be removed; and n-type bonding pads 228 and any desired circuit patterns may be fabricated on the remaining n-GaN 201 to generate the working structure 200 depicted in the figure. Afterwards, the surface 229 of the structure 200 having n-GaN 201 with patterning and pads 228 may be passivated by a protection layer 130 that may be photosensitive or non-photosensitive material (e.g., a wax, a polymer, a polyimide, a parylene, epoxy, resist, thermoplastic, ZnO, $Ta_2O_5$, $TiO_2$, HfO, or MgO).

In the first separation step, a wafer having dies 202 fabricated thereon may be separated by laser cut, saw cut, and/or water jet processes. In FIG. 15, a laser 134 has been used to cut through all of the layers in the area of the street 106 according to some embodiments of the invention. The strong and conductive metal layer 112 and the conductive passivation layer 222 may be merged together and oxidized by laser heating. The whole wafer after laser cutting may be handled with greater confidence than conventional wafers because of the strong and hard merged metal 138 of layers 112 and 222 in the street 106. By applying a temporary adhesive 136 to the backside of the dies 202 for some embodiments, a saw cut or water jet, for example, may be used to cut through the layers in the area of street 106 while the ability to handle the wafer and the dies 202 disposed thereon is maintained.

Figure 16:
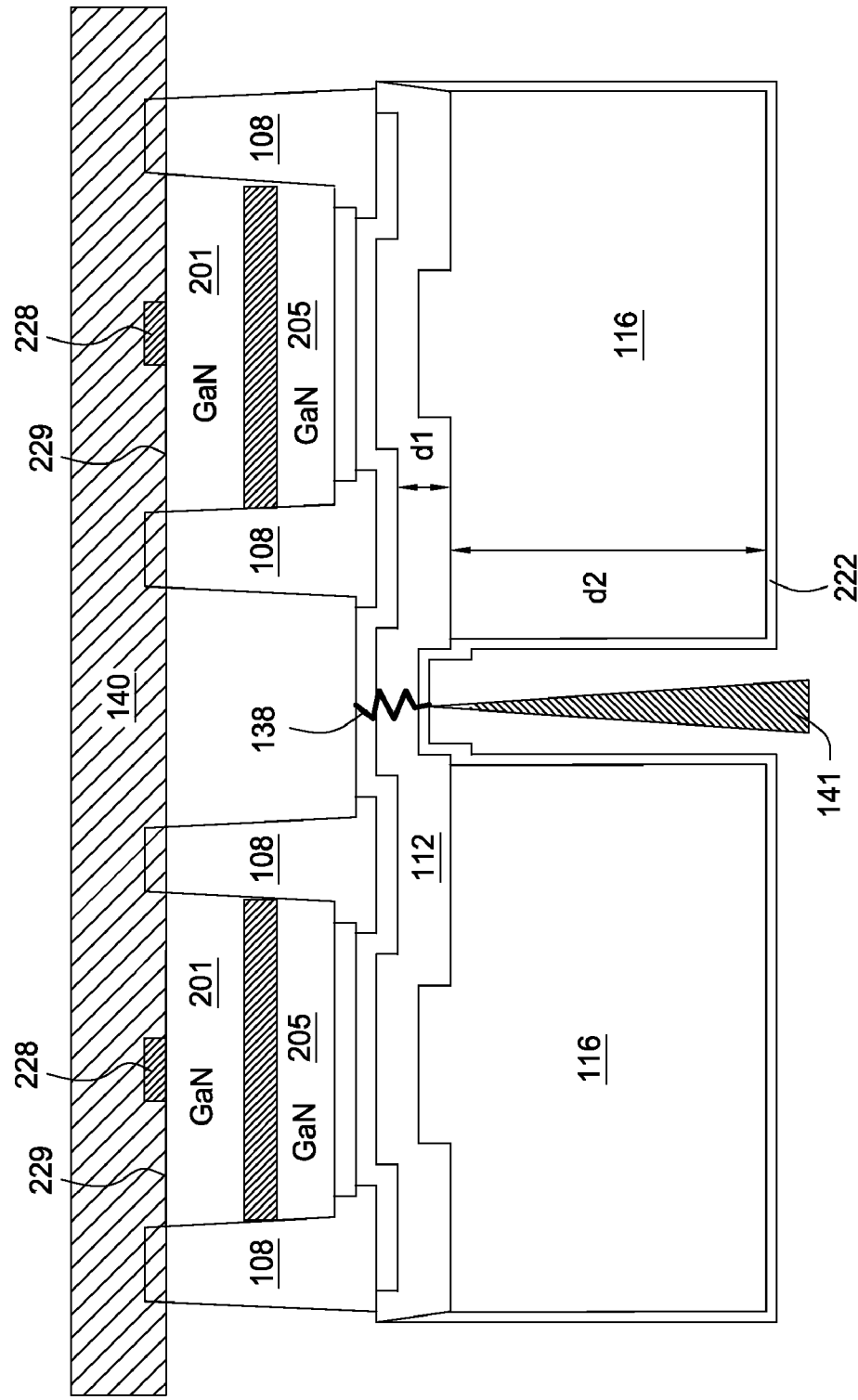
FIG. 16 illustrates addition of an adhesive expandable material and a breaker, air knife, or water jet applied to the streets of FIG. 15 in accordance with an embodiment of the present invention.

Referring now to FIG. 16, the protection layer 130 may be removed by wet etching or ICP/RIE. The contamination from die cutting may also be cleaned or cleared away with the removal of the protection layer 130. After removal of the protection layer 130, the whole wafer with VLED dies 202 may be added onto an adhesive expandable material 140, such as UV tape. The methods to separate the VLED dies 202 may include using a breaker 141, an air knife, and/or a water jet with a chemical solution (for additional coating of the anti-oxidizing material on the cut edge 142 of layer 112) in an effort to break the merged metal layers 138 on the street 106.

Figure 17:
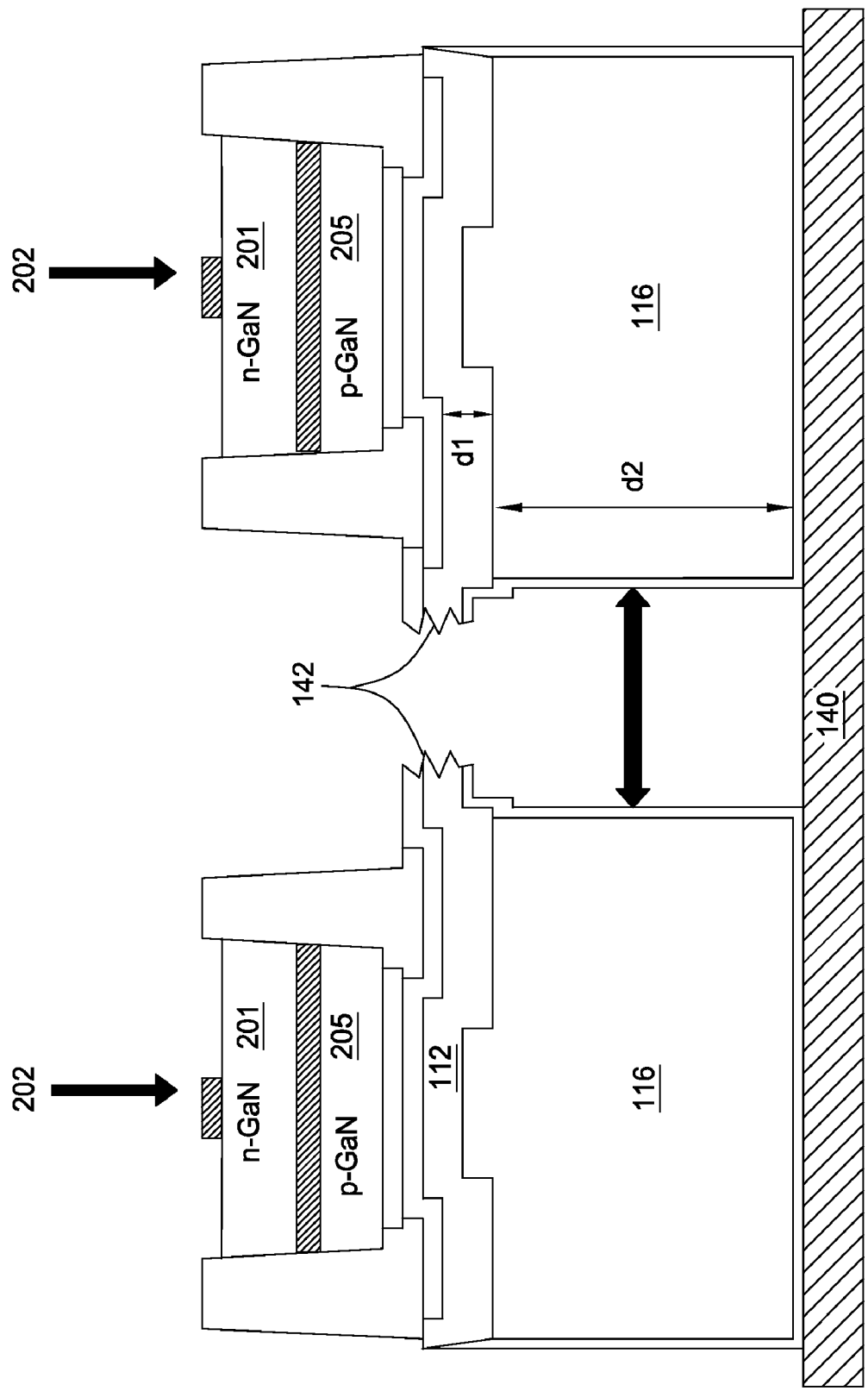
FIG. 17 illustrates separating the VLED dies of FIG. 16 after separation by the breaker, air knife, or water jet by expanding the adhesive material in accordance with an embodiment of the present invention.

Next, the structure 200 may be flipped over, and the tape or other adhesive material 140 may be optionally expanded to further separate the VLED dies 202 as illustrated in FIG. 17 to achieve a desired separation distance.

While the foregoing is directed to embodiments of the present invention, other and further embodiments of the invention may be devised without departing from the basic scope thereof, and the scope thereof is determined by the claims that follow.

The invention claimed is:

1. A method of fabricating a plurality of semiconductor dies, comprising:
    forming one or more semiconductor layers on a substrate;
    defining the plurality of semiconductor dies in the semiconductor layers such that the dies are separated by street areas;
    forming a thin handling structure on the semiconductor layers above the semiconductor dies and the street areas;
    forming a thick handling structure on the thin handling structure above the semiconductor dies, but not above the street areas;
    removing the substrate; and
    after removing the substrate, cutting through the thin handling structure in the street areas between the dies.

2. The method of claim 1, wherein the thin handling structure is configured to allow for manipulation of the plurality of semiconductor dies after removing the substrate.

3. The method of claim 1, wherein the hardness of the thin handling structure is greater than 100 HV.

4. The method of claim 1, wherein the thickness of the thin handling structure is greater than 1 µm.

5. The method of claim 1, wherein the thin handling structure comprises a plurality of metal layers.

6. The method of claim 1, wherein the thin handling structure comprises at least one of Cu, Ni, Mo, W, Co, Pd, Pt, Ni—Co, Ag, Au, Cu—Co, Cu—Mo, Cu/Ni, Cu/Ni—Co, Cu/Ni—Co/Cu, Cu/Ni—Co/Cu/Ni—Co, Cu/Ni/Cu—Mo, and alloys thereof.

7. The method of claim 1, wherein forming the thin handling structure comprises at least one of electroplating, electroless plating, and metal bonding.

8. The method of claim 1, further comprising depositing a barrier layer above the thick and the thin handling structures before removing the substrate.

9. The method of claim 8, wherein the barrier layer is a conductor comprising at least one of Cr/Au, Ni/Au, Ti/Au, Al/Ti, Ag/Ti, Cr/Au/Ti/Ni/Au, Ti/Ni/Au, Ni—Co/Au, W/Au, Mo/Au.

10. The method of claim 8, wherein the barrier layer is a semiconductor comprising at least one of Si, GaAs, GaP, and InP.

11. The method of claim 8, wherein the barrier layer is an insulator comprising at least one of a polymer, a polyimide, epoxy, a parylene, a resist, a dry film resist, thermoplastic, $SiO_2$, $Si_3N_4$, ZnO, $Ta_2O_5$, $TiO_2$, HfO, and MgO.

12. The method of claim 1, further comprising:
forming a protection layer on a surface of the semiconductor layers exposed by removing the substrate before cutting through the thin handling structure; and
removing the protection layer after the cutting.

13. The method of claim 12, wherein the protection layer comprises at least one of wax, epoxy, a polymer, thermoplastic, a polyimide, a parylene, resist, $SiO_2$, $Si_3N_4$, ZnO, $Ta_2O_5$, $TiO_2$, HfO, and MgO.

14. The method of claim 1, wherein cutting through the thin handling structure comprises at least one of laser cutting, saw cutting, and applying a water jet.

15. The method of claim 1, wherein forming the thick handling structure comprises:
forming stop electroplating (EP) areas in the street areas above the thin handling structure;
depositing one or more metal layers as the thick handling structure, wherein the stop EP areas discourage metal deposition in at least portions of the street areas; and
removing the stop EP areas before cutting through the thin handling structure.

16. The method of claim 15, wherein depositing the one or more metal layers comprises at least one of physical vapor deposition (PVD), evaporation, plasma spray, chemical vapor deposition (CVD), and electroless deposition.

17. The method of claim 1, wherein the thick handling structure has a thickness in a range of 5 µm to 700 µm.

18. A method of fabricating a plurality of semiconductor dies, comprising:
forming one or more semiconductor layers on a substrate;
defining the plurality of semiconductor dies in the semiconductor layers such that the dies are separated by street areas;
forming one or more handling layers above the semiconductor layers;
forming stop electroplating (EP) areas in the street areas;
depositing a plurality of metal layers above the handling layers, wherein the stop EP areas discourage metal deposition in at least portions of the street areas;
removing the stop EP areas;
removing the substrate to expose a surface of the semiconductor layers; and
after removing the substrate, cutting through the handling layers in the portions of the street areas between the dies where the metal layers were not deposited.

19. The method of claim 18, further comprising:
depositing one or more connected conductor layers above the semiconductor layers before forming the handling layers; and
cutting through the connected conductor layers when cutting through the handling layers.

20. The method of claim 18, wherein the handling layers provide for manipulation of the plurality of semiconductor dies after removing the substrate.

21. The method of claim 18, wherein the hardness of the handling layers is greater than 100 HV.

22. The method of claim 18, wherein the thickness of the handling layers is greater than 1 µm.

23. The method of claim 18, wherein the handling layers comprise at least one of Cu, Ni, Mo, W, Co, Pd, Pt, Ni—Co, Ag, Au, Cu—Co, Cu—Mo, Cu/Ni, Cu/Ni—Co, Cu/Ni—Co/Cu, Cu/Ni—Co/Cu/Ni—Co, Cu/Ni/Cu—Mo, and alloys thereof.

24. The method of claim 18, wherein forming the handling layers comprises at least one of electroplating, electroless plating, and metal bonding.

25. The method of claim 18, further comprising depositing a barrier layer above the plurality of metal layers before removing the substrate.

26. The method of claim 25, wherein the barrier layer is a conductor comprising at least one of Cr/Au, Ni/Au, Ti/Au, Al/Ti, Ag/Ti, Cr/Au/Ti/Ni/Au, Ti/Ni/Au, Ni—Co/Au, W/Au, Mo/Au.

27. The method of claim 25, wherein the barrier layer is a semiconductor comprising at least one of Si, GaAs, GaP, and InP.

28. The method of claim 25, wherein the barrier layer is an insulator comprising at least one of a polymer, a polyimide, epoxy, a parylene, a resist, a dry film resist, thermoplastic, $SiO_2$, $Si_3N_4$, ZnO, $Ta_2O_5$, $TiO_2$, HfO, and MgO.

29. The method of claim 25, further comprising:
applying an adhesive to the barrier layer; and
expanding the adhesive to separate the plurality of semiconductor dies.

30. The method of claim 18, further comprising:
applying an adhesive to the exposed surface of the semiconductor layers or a surface of the plurality of metal layers; and
expanding the adhesive to separate the plurality of semiconductor dies after the cutting.

31. The method of claim 30, wherein the adhesive comprises ultraviolet-curable (UV) tape or metal tape.

32. The method of claim 18, wherein depositing the metal layers comprises at least one of physical vapor deposition (PVD), evaporation, plasma spray, chemical vapor deposition (CVD), and electroless deposition.

33. The method of claim 18, wherein the stop EP areas comprise at least one of a polymer, a polyimide, epoxy, a resist, thermoplastic, a parylene, a dry film resist, SU-8, or NR7.

34. The method of claim 18, wherein cutting through the handling layers and the connected conductor layers comprises at least one of laser cutting, saw cutting, and applying a water jet.

35. The method of claim 18, wherein cutting through the handling layers comprises laser cutting and merging of the laser cut handling layers.

36. The method of claim 35, further comprising breaking the merged cut handling layers apart with a breaker, an air knife, or a water jet.

37. The method of claim 18, wherein removing the stop EP areas comprises wet etching.

38. The method of claim 18, further comprising adding bonding pads or circuit patterns to the exposed surface of the semiconductor layers.

39. The method of claim 38, further comprising:
forming a protection layer above the bonding pads or the circuit patterns before cutting through the handling layers and the connected conductor layers; and
removing the protection layer after the cutting.

40. The method of claim 39, wherein the protection layer comprises at least one of wax, epoxy, a polymer, thermoplastic, a polyimide, a parylene, resist, $SiO_2$, $Si_3N_4$, ZnO, $Ta_2O_5$, $TiO_2$, HfO, and MgO.

41. The method of claim 18, wherein the plurality of semiconductor dies are vertical light-emitting diode (VLED) dies.

42. A method of fabricating a plurality of semiconductor dies, comprising:
providing a working structure having the plurality of semiconductor dies separated by street areas and disposed on a substrate;
forming one or more handling layers above the plurality of semiconductor dies and the street areas;
depositing one or more conductive metal layers on the handling layers above the semiconductor dies, but not above the street areas;
removing the substrate from the working structure; and
after removing the substrate, cutting through the handling layers in the street areas between the dies in order to separate the dies, wherein the handling layers allow for manipulation of the working structure after the substrate is removed.

43. The method of claim 42, wherein the hardness of the handling layers is greater than 100 HV.

44. The method of claim 42, further comprising adding a barrier layer configured to reduce stress during the manipulation of the working structure, the barrier layer added above the conductive metal layers and the street areas before cutting through the handling layers.

45. The method of claim 42, wherein depositing the conductive metal layers comprises:
forming stop electroplating (EP) areas in the street areas;
depositing the conductive metal layers above the handling layers, wherein the stop EP areas discourage metal deposition in at least portions of the street areas; and
removing the stop EP areas.

46. The method of claim 42, further comprising:
applying an adhesive to a surface of the semiconductor dies exposed by removing the substrate; and
expanding the adhesive to separate the plurality of semiconductor dies after the cutting.

* * * * *